United States Patent
French et al.

(10) Patent No.: US 11,183,368 B2
(45) Date of Patent: Nov. 23, 2021

(54) RF TUNING SYSTEMS INCLUDING TUNING CIRCUITS HAVING IMPEDANCES FOR SETTING AND ADJUSTING PARAMETERS OF ELECTRODES IN ELECTROSTATIC CHUCKS

(71) Applicant: LAM RESEARCH CORPORATION, Fremont, CA (US)

(72) Inventors: David French, Portland, OR (US); Vincent E. Burkhart, Cupertino, CA (US); Karl Frederick Leeser, West Linn, OR (US); Liang Meng, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 492 days.

(21) Appl. No.: 16/052,877

(22) Filed: Aug. 2, 2018

(65) Prior Publication Data
US 2020/0043703 A1 Feb. 6, 2020

(51) Int. Cl.
*H01J 37/32* (2006.01)
*C23C 16/455* (2006.01)
(Continued)

(52) U.S. Cl.
CPC .. *H01J 37/32183* (2013.01); *C23C 16/45565* (2013.01); *H01J 37/32458* (2013.01);
(Continued)

(58) Field of Classification Search
CPC ......... H01L 37/32183; H01L 37/32458; H01L 37/32541; H01L 37/32568;
(Continued)

(56) References Cited

U.S. PATENT DOCUMENTS

| | | | |
|---|---|---|---|
| 2010/0126847 A1* | 5/2010 | Dhindsa | H01J 37/32082 204/164 |
| 2017/0110358 A1* | 4/2017 | Sadjadi | H01L 21/02274 |
| 2018/0025891 A1 | 1/2018 | Marakhtanov et al. | |

FOREIGN PATENT DOCUMENTS

| | | |
|---|---|---|
| JP | 2017228526 A | 12/2017 |
| KR | 10-2008-0077202 A | 8/2008 |

(Continued)

OTHER PUBLICATIONS

First Office Action in corresponding Korean Application No. 10-2019-0073864; dated Aug. 30, 2019; 6 pages.
(Continued)

*Primary Examiner* — Justin C Dodson
(74) *Attorney, Agent, or Firm* — Weaver Austin Villeneuve & Sampson LLP

(57) ABSTRACT

A substrate processing system for processing a substrate within a processing chamber is provided and includes a source terminal, a substrate support, and a tuning circuit. The substrate support holds the substrate and includes first and second electrodes, which receive power from a power source via the source terminal. The tuning circuit is connected to the first electrode or the second electrode. The tuning circuit is allocated for tuning signals provided to the first electrode. The tuning circuit includes at least one of a first impedance set or a second impedance set. The first impedance set is serially connected between the first electrode and the power source and receives a first signal from the power source via the source terminal. The second impedance set is connected between an output of the power source and a reference terminal and receives the first signal from the power source via the source terminal.

42 Claims, 13 Drawing Sheets

(51) Int. Cl.
*H01L 21/683* (2006.01)
*H05B 1/02* (2006.01)
*H05H 1/24* (2006.01)

(52) U.S. Cl.
CPC .. *H01J 37/32541* (2013.01); *H01J 37/32568* (2013.01); *H01J 37/32577* (2013.01); *H01J 37/32697* (2013.01); *H01J 37/32724* (2013.01); *H01L 21/6833* (2013.01); *H05B 1/02* (2013.01); *H05H 1/24* (2013.01); *H01J 2237/334* (2013.01)

(58) Field of Classification Search
CPC ......... H01L 37/32577; H01L 37/32697; H01L 37/32724; H01L 37/32334; H05H 1/34; H05H 1/36; H05H 1/02; B23K 10/006
USPC ............ 219/121.43, 121.44, 121.48, 121.54; 315/119; 156/345.47, 345.44, 345.51; 118/723 R
See application file for complete search history.

(56) References Cited

FOREIGN PATENT DOCUMENTS

| KR | 10-20160000400 A | 1/2016 |
| KR | 10-2016-0127717 A | 11/2016 |
| KR | 10-2017-0054239 A | 5/2017 |
| KR | 10-2018-0000291 A | 1/2018 |
| KR | 10-2018-0011711 A | 2/2018 |

OTHER PUBLICATIONS

International Search Report and Written Opinion regarding PCT/US2019/044113, dated Dec. 19, 2019, 11 pages.
Korean Prior Art Search Report (no translation provided) issued in corresponding KR Application No. 10-2019-0073864, dated Aug. 1, 2019, 5 pages.
Office Action issued in corresponding Korean Patent Application 10-2021-0056493 dated Jun. 7, 2021.

* cited by examiner

RF TUNING SYSTEMS INCLUDING TUNING CIRCUITS HAVING IMPEDANCES FOR SETTING AND ADJUSTING PARAMETERS OF ELECTRODES IN ELECTROSTATIC CHUCKS

FIELD

The present disclosure relates to electric holding devices using electrostatic attraction, and more particularly to tuning circuits for clamping and radio frequency (RF) electrodes of electric holding devices.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a physical vapor deposition (PVD) process, an ion implantation process, and/or other etch, deposition, and cleaning processes. As an example, during an etching process, a substrate may be arranged on an electrostatic chuck (ESC) in a substrate processing system and a thin film on the substrate is etched.

SUMMARY

A substrate processing system for processing a substrate within a processing chamber is provided. The substrate processing system includes a source terminal, a substrate support, and a first tuning circuit. The substrate support is configured to hold the substrate. The substrate support includes electrodes. The electrodes include a first electrode and a second electrode. The first electrode and the second electrode receive power from a first power source via the source terminal. The first tuning circuit is connected to at least one of the first electrode and the second electrode. The first tuning circuit is allocated for tuning one or more signals provided to the first electrode. The first tuning circuit includes at least one of a first impedance set or a second impedance set. The first impedance set is serially connected between the first electrode and the first power source. The first impedance set receives a first signal from the first power source via the source terminal. The one or more signals include the first signal. The second impedance set is connected between an output of the first power source and a reference terminal. The second impedance set receives the first signal from the first power source via the source terminal.

In other features, the first tuning circuit includes the first impedance set and the second impedance set. In other features, the substrate processing system further includes a system controller configured to adjust values of impedances in the first impedance set and values of impedances in the second impedance set.

In other features, the first tuning circuit adjusts a voltage, a current level, a phase, a power level and/or a frequency of the one or more signals provided to the first electrode. In other features, the first tuning circuit includes the first impedance set and the second impedance set. The second impedance set is connected between the first impedance set and the reference terminal.

In other features, the first power source includes a matching network. The matching network is connected between the first power source and the source terminal. The first tuning circuit is connected between the source terminal and the first electrode.

In other features, the first tuning circuit is not included in a matching network. In other features, no matching network is connected between the first power source and the first tuning circuit.

In other features, the substrate processing system further includes a second tuning circuit. The first tuning circuit is configured to adjust a voltage, a current level, a phase, a power level or a frequency of the first signal provided from the first power source to the first electrode. The second tuning circuit is configured to adjust a voltage, a current level, a phase, a power level or a frequency of the first signal provided from the first power source to the second electrode. The one or more signals include the first signal.

In other features, the substrate processing system further includes a second power source and a second tuning circuit. The first tuning circuit is configured to adjust a voltage, a current level, a phase, a power level or a frequency of the first signal provided from the first power source to the first electrode. The second tuning circuit is configured to adjust a voltage, a current level, a phase, a power level or a frequency of a second signal provided from the second power source to the second electrode. The one or more signals comprise the first signal and the second signal.

In other features, the electrodes of the substrate support are concentrically disposed.

In other features, the substrate processing system further includes a second tuning circuit and a third tuning circuit. The electrodes include a third electrode. The first tuning circuit is connected to the first electrode and is configured to modify the first signal prior to being received at the first electrode. The second tuning circuit is connected to the second electrode and is configured to modify the first signal or a second signal prior to being received at the second electrode. The third tuning circuit is connected to the third electrode and is configured to modify the first signal or a third signal prior to being received at the third electrode. In other features, the first electrode, second electrode, and third electrode are concentrically disposed.

In other features, the substrate support is an electrostatic chuck. The first electrode and the second electrode are clamping electrodes and are configured to receive clamping voltages to clamp the substrate to the substrate support. The third electrode is a bias electrode and configured to receive a bias voltage. The third signal is received by the third tuning circuit from a third power source.

In other features, the substrate support is an electrostatic chuck. The first electrode is a clamping electrode. The second electrode and the third electrode are bias electrodes. The second signal is received by the second tuning circuit from a second power source.

In other features, the substrate support is an electrostatic chuck. The first electrode is a clamping electrode. The second electrode is a clamping electrode. The electrodes include an electrode ring. The first tuning circuit includes the first impedance set, a third impedance set, and a fourth impedance set. The first impedance set includes a first inductor and a first capacitor connected between the first clamping electrode and the first power source. The third impedance set includes a second inductor and a second capacitor connected between the electrode ring and the first power source. The fourth impedance set includes a third inductor and a third capacitor connected between the second clamping electrode and the first power source.

In other features, the substrate support is an electrostatic chuck. The first electrode is a clamping electrode. The second electrode is a clamping electrode. The electrodes include an electrode ring. The first tuning circuit includes the second impedance set, a third impedance set and a fourth impedance set. The second impedance set includes a first inductor and a first capacitor connected in parallel between a first electrode terminal and the reference terminal, wherein the first electrode terminal is connected between the first clamping electrode and the first power source. The third impedance set includes a second inductor and a second capacitor connected in parallel between a second electrode terminal and the reference terminal. The second electrode terminal is connected between the electrode ring and the first power source. The fourth impedance set includes a third inductor and a third capacitor connected in parallel between a third electrode terminal and the reference terminal. The third electrode terminal is connected between the second clamping electrode and the first power source.

In other features, the substrate support is an electrostatic chuck. The first electrode is a clamping electrode. The second electrode is a clamping electrode. The electrodes include an electrode ring. The first tuning circuit includes the first impedance set, the second impedance set, a third impedance set, a fourth impedance set, a fifth impedance set, and a sixth impedance set. The first impedance set includes a first inductor and a first capacitor connected between the first clamping electrode and the first power source. The third impedance set includes a second inductor and a second capacitor connected between the electrode ring and the first power source. The fourth impedance set includes a third inductor and a third capacitor connected between the second clamping electrode and the first power source. The second impedance set includes a fourth inductor and a fourth capacitor connected in parallel between a first electrode terminal and the reference terminal. The first electrode terminal is connected between the first clamping electrode and the first power source. The fifth impedance set includes a fifth inductor and a fifth capacitor connected in parallel between a second electrode terminal and the reference terminal. The second electrode terminal is connected between the electrode ring and the first power source. The sixth impedance set includes a sixth inductor and a sixth capacitor connected in parallel between a third electrode terminal and the reference terminal. The third electrode terminal is connected between the second clamping electrode and the first power source.

In other features, the substrate processing system further includes a second power source connected to the first terminal, the second terminal and the third terminal.

In other features, the substrate processing system further includes a second tuning circuit. The substrate support is an electrostatic chuck. The first electrode is a first clamping electrode. The second electrode is a second clamping electrode. The electrodes include an electrode ring. The first tuning circuit includes the first impedance set, a third impedance set, and a fourth impedance set. The second tuning circuit includes the second impedance set, a fifth impedance set, and a sixth impedance set. The first impedance set includes a first inductor and a first capacitor connected between the first clamping electrode and the first power source. The third impedance set includes a second inductor and a second capacitor connected between the electrode ring and a second power source. The fourth impedance set includes a third inductor and a third capacitor connected between the second clamping electrode and the first power source. The second impedance set includes a fourth inductor and a fourth capacitor connected in parallel between a first electrode terminal and the reference terminal. The first electrode terminal is connected between the first clamping electrode and the first power source. The fifth impedance set includes a fifth inductor and a fifth capacitor connected in parallel between a second electrode terminal and the reference terminal. The second electrode terminal is connected between the electrode ring and the second power source. The sixth impedance set includes a sixth inductor and a sixth capacitor connected in parallel between a third electrode terminal and the reference terminal. The third electrode terminal is connected between the second clamping electrode and the first power source.

In other features, no matching network is connected between the source terminal and the electrodes. In other features, power from the first power source is split to provide portions of the power respectively to the electrodes. In other features, the first impedance set and the second impedance set include variable inductances.

In other features, the substrate processing system further includes the processing chamber, the first power source and a controller. The controller is configured to adjust impedances of the first impedance set and the second impedance set.

In other features, a substrate processing system for processing a substrate within a processing chamber is provided. The substrate processing system includes substrate support, a first impedance and a second impedance. The substrate support is configured to hold the substrate, wherein the substrate support includes electrodes. The electrodes include a first electrode, a second electrode and a third electrode. The first impedance is connected between the first electrode and the third electrode. The second impedance is connected between the second electrode and the third electrode. The first impedance is connected (i) between the first electrode and the second impedance, and (ii) between a first power source and the second impedance. The second impedance is connected (i) between the second electrode and the first impedance, and (ii) between a second power source and the first impedance. The first impedance and the second impedance are allocated for tuning (i) a first signal provided by the first power source to the first electrode, and (ii) a second signal provided by the second power source to the second electrode.

In other features, the first impedance is connected in series with the second impedance. In other features, the first impedance is connected between the first electrode and a third power source. The second impedance is connected between the second electrode and the third power source. In other features, the third power source is connected to the third electrode.

In other features, the substrate processing system further includes a third impedance and a fourth impedance. The third impedance is connected (i) between the first electrode and the third electrode, (ii) between the first electrode and the fourth impedance, and (iii) between the first power source and the fourth impedance. The fourth impedance is connected (i) between the second electrode and the third electrode, (ii) between the second electrode and the third impedance, and (iii) between the second power source and the third impedance. The third impedance and the fourth impedance are allocated for tuning (i) the first signal provided by the first power source to the first electrode, and (ii) the second signal provided by the second power source to the second electrode.

In other features, the first impedance and the third impedance are connected in parallel between the first electrode and a third power source. The second impedance and the fourth impedance are connected in parallel between the second electrode and the third power source. In other features, the third power source is connected to the third electrode. In other features, the first impedance set and the second impedance set include variable inductances.

In other features, the substrate processing system further includes the processing chamber, the first power source and a controller. The controller is configured to adjust impedances of the first impedance set and the second impedance set.

In other features, a method of operating a substrate processing system is provided. The method includes: selecting a process; determining a recipe includes system operating parameters for the selected process; controlling actuators to set the system operating parameters; and setting impedance values of a first tuning circuit based on the selected process and the system operating parameters. The first tuning circuit is connected to a first electrode in a substrate support. The first tuning circuit is allocated for tuning a signal provided to the first electrode. The first tuning circuit includes at least one of: a first impedance set serially connected between the first electrode and a first power source, where the first impedance set receives a first signal from the first power source, and where the one or more signals include the first signal; or a second impedance set connected between an output of the first power source and a reference terminal. The second impedance set receives the first signal from the first power source. The method further includes: arranging a substrate on the substrate support in a processing chamber; and performing processing operations for the selected process includes providing power from the first power source to electrodes in the substrate support. The electrodes include the first electrode and a second electrode. The first electrode and the second electrode receive power from the first power source via a source terminal.

In other features, the method further includes, while performing the processing operations, adjusting the impedance values of the first tuning circuit. In other features, the method further includes, while performing the processing operations: collecting sensor output data; determining one or more parameters based on the sensor output data; and adjusting the impedance values of the first tuning circuit based on the one or more parameters.

In other features, the method further includes: determining a feature or a characteristic of the processing chamber; and setting the impedance values of the first tuning circuit based on the feature or the characteristic.

In other features, the method further includes: determining a feature or a characteristic of the substrate support; and setting the impedance values of the first tuning circuit based on the feature or the characteristic.

In other features, the method further includes adjusting, based on changes in the characteristic, impedances of at least one of the first impedance set or the second impedance set to follow respective trajectories. In other features, the method further includes calculating or determining the trajectories based on at least one of: the feature; the characteristic; one or more features of the substrate; the substrate support or the processing chamber; and one or more other characteristics of the substrate, the substrate support or processing chamber.

In other features, the method further includes: determining a feature or a characteristic of the substrate; and setting the impedance values of the first tuning circuit based on the feature or the characteristic.

In other features, the method further includes: supplying a clamping voltage to the first electrode via the first power source to clamp the substrate to the substrate support; supplying a bias voltage to the second electrode; and tuning the clamping voltage and the bias voltage via the first tuning circuit or a second tuning circuit. The substrate support is an electrostatic chuck. In other features, the first tuning circuit includes the first impedance and the second impedance.

In other features, the method further includes: adjusting values of impedances of the first tuning circuit to tune the clamping voltage supplied to the first electrode; and adjusting values of impedances of the second tuning circuit to tune the bias voltage supplied to the second electrode. The substrate support is an electrostatic chuck. In other features, the method further includes adjusting voltage potential differences of plasma between respective pairs of points above and across a surface of the substrate support by adjusting the impedance values of the first tuning circuit.

In other features, the method further includes adjusting impedance values in a bias radio frequency matching network based on the impedance values of the first tuning circuit. The bias radio frequency matching network is connected between the power source and the first tuning circuit.

In other features, a substrate processing system for processing a substrate within a processing chamber is provided. The substrate processing system includes a source terminal, a substrate support, a first tuning circuit, and a second tuning circuit. The substrate support is configured to hold the substrate. The substrate support includes electrodes. The electrodes include a first electrode and a second electrode. The first tuning circuit is connected to the first electrode and allocated for tuning impedances of the first electrode. The first tuning circuit includes a first impedance set connected to the first electrode and a ground. The second tuning circuit is connected to the second electrode and allocated for tuning impedances of the second electrode. The second tuning circuit includes a second impedance set connected to the second electrode and the ground.

In other features, the first tuning circuit is connected in series between the first electrode and the ground. In other features, the first tuning circuit includes an inductor and a capacitor. In other features, the second tuning circuit is connected in series between the second electrode and the ground. In other features, the second tuning circuit includes an inductor and a capacitor. In other features, the first tuning circuit is connected between the first electrode and the second electrode. The first electrode and the second electrode are connected to the ground.

In other features, the substrate processing system further includes a third electrode connected to the ground and a third tuning circuit connected between the second electrode and the third electrode. In other features, the first tuning circuit includes a first inductor and a first capacitor. The second tuning circuit includes a second inductor and a second capacitor.

In other features, the first tuning circuit and the second tuning circuit include variable inductances. In other features, the substrate processing system further includes the processing chamber, and a controller configured to adjust impedances of the first impedance set and the second impedance set.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
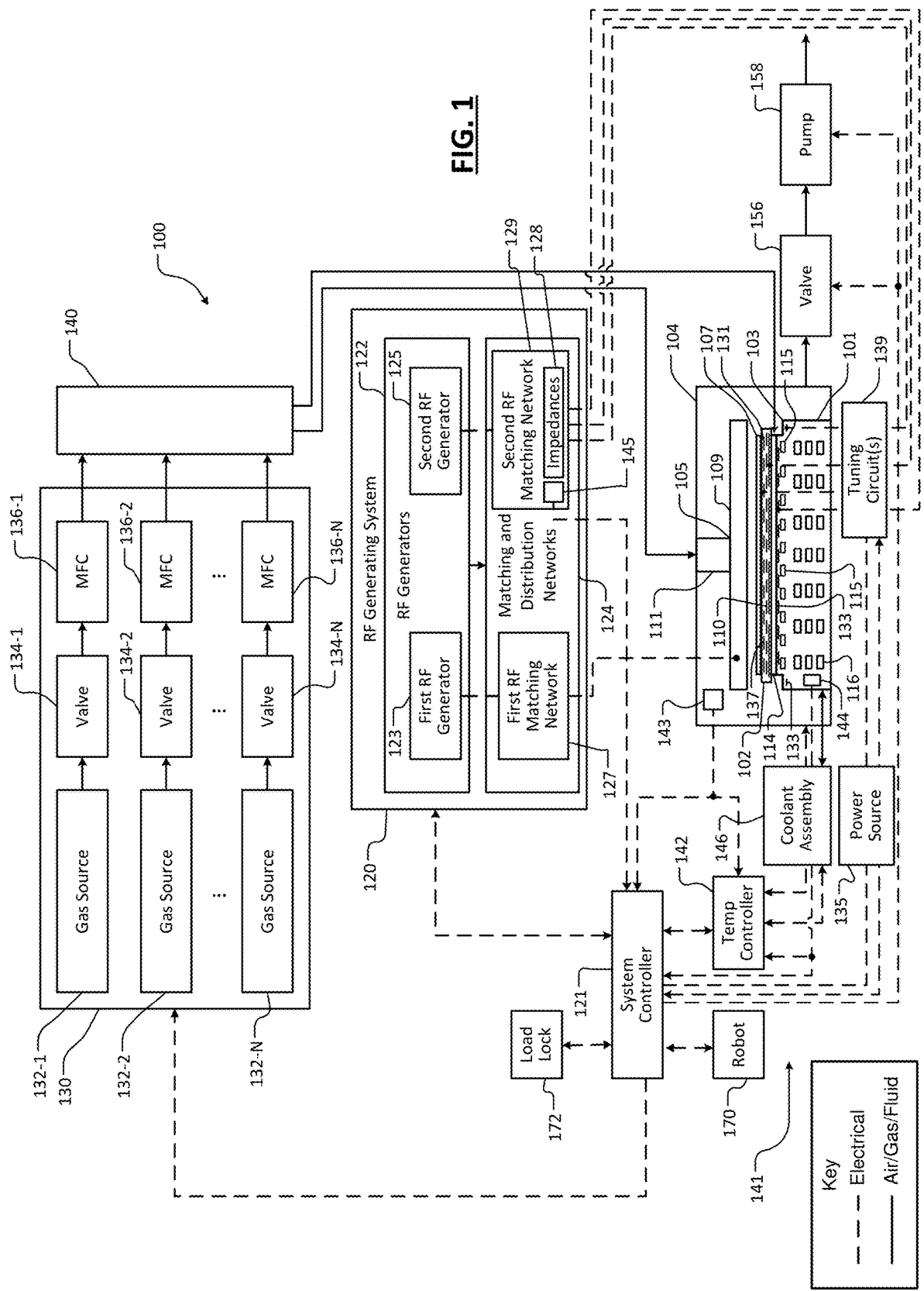
FIG. 1 is a functional block diagram of an example of a substrate processing system incorporating an ESC with electrodes and corresponding tuning circuit(s) in accordance with an embodiment of the present disclosure.

In a capacitive coupled plasma (CCP) system, RF voltage signals can be supplied to a showerhead and/or a substrate support (e.g., an electrostatic chuck or pedestal) in a processing chamber in order to create and sustain plasma provided for substrate processing (e.g., plasma provided during etching or deposition processes). As an example, the substrate support may include multiple electrodes for receiving RF voltages. The electrodes have respective geometries and thus may have different sizes and shapes and may be disposed in different locations within the substrate support.

The examples set forth herein include tuning circuits for controlling the RF voltages supplied to the electrodes of a substrate support. The tuning circuits include variable and/or fixed impedances that may be tuned for the substrate processing being performed. The RF voltages and corresponding current supplied to the electrodes may be controlled to change aspects of generated plasma. During processing, a substrate is disposed on the substrate support and one or more layers (e.g., film layers) of the substrate may be, for example, etched or deposited. By tailoring the RF voltages supplied to the different electrodes, parameters of the one or more layers can be altered and/or tuned in a spatial manner across the wafer according to the location of the electrodes. As an example, parameters of the one or more layers may include uniformity values, stress values, a refractive index, an etch rate, a deposition rate, thickness values, and/or other intrinsical property values that are measured quantities.

RF power is disclosed as being provided from one or more RF power sources. In one embodiment, RF power is provided by feeding a common node RF power from a single RF power source. The RF power is then provided from the common node to different electrodes of a substrate support via respective paths. The paths include the tuning circuits and/or impedances, which alter the corresponding RF voltages, current levels, phases, and/or frequency content. The impedances may include series or shunt connected impedances. Other embodiments including multiple power sources, multiple nodes, and various paths are disclosed herein.

The RF voltages and current levels provided to the electrodes in a substrate support may also be altered by adjusting the size, shape, and pattern of the electrodes. For example, the RF voltages and amounts of current provided from annular-shaped and/or circular-shaped electrodes to plasma, the substrate processing performed using the annular-shaped and/or circular-shaped electrodes, and/or the resulting substrate characteristics can be altered and/or tuned by changing radii of the electrodes.

A substrate processing system may have multiple features, characteristics and/or parameters that provide degrees-of-freedom and may be set and/or adjusted to control resulting aspects of layers of a substrate during substrate processing. For example, RF power levels, chamber geometry, use of a focusing ring, showerhead hole patterns, showerhead shapes, electrode patterns, gas pressures, gas compositions, etc. may be set and/or controlled to provide a resultant substrate with a target layer make up and profile.

The disclosed examples provide another degree-of-freedom for tuning a profile of one or more layers of a substrate.

The degree-of-freedom is provided by the setting and/or adjusting of the impedances (e.g., selecting, changing and/or controlling capacitances, inductances, reactances, resistances, layout, etc.) of the tuning circuits. The profile refers to the above-stated parameters of the one or more layers.

A radial profile of a substrate may be altered, for example, by altering metallic or dielectric annular elements near a circumferential edge of the substrate. This may include adjusting parameters, such as gas pressures, gas flow rates, gas composition, RF discharge power, frequencies of RF signals provided to electrodes of a substrate support, and/or other parameters. Altering these parameters at certain locations to provide a target layer feature (e.g., a certain layer thickness or shape at the circumferential edge) can alter other parameters and/or affect other features in the same location and/or in other locations. Thus, these parameters do not independently adjust certain features. As another example, a circumferential edge of a substrate may be altered by using a focusing ring located outside the circumferential edge of the substrate. The use of the focusing ring can however affect flow rates of gas at a center of the substrate, which can affect processing and thus a result at the center of the substrate. Other example layer features are a certain trench depth or width, distances between trenches, distances between conductive elements, layer compositions, etc.).

The more parameters and degrees-of-freedom in setting and controlling tuning of a profile of one or more layers of a substrate, the more likely certain features are able to be provided without negatively affecting other features. Also, as the number of parameters and degrees-of-freedom increase, the number, makeup and layout (or pattern) of features that can be formed increases. The examples disclosed herein increase substrate layer design flexibility and location specific design selectivity and allow a substrate processing system to provide a diverse set of features.

FIG. 1 shows a substrate processing system 100 incorporating an ESC 101. The ESC 101 may be configured the same or similarly as any of the ESCs disclosed herein. Although FIG. 1 shows a capacitive coupled plasma (CCP) system, the embodiments disclosed herein are applicable to transformer coupled plasma (TCP) systems, electron cyclotron resonance (ECR) plasma systems, inductively coupled plasma (ICP) systems and/or other systems and plasma sources that include a substrate support. The embodiments are applicable to PVD processes, PECVD processes, chemically enhanced plasma vapor deposition (CEPVD) processes, ion implantation processes, plasma etching processes, and/or other etch, deposition, and cleaning processes.

The ESC 101 may include a top plate 102 and a baseplate 103. Although the ESC 101 is shown as having two plates, the ESC may include a single plate. The plates 102, 103 may be formed of ceramic and/or other materials. Although the ESCs of FIGS. 1-5 and 7-11 are each shown as having certain features and not other features, each of the ESCs may be modified to include any of the features disclosed herein and in FIGS. 1-5 and 7-11.

Although the ESC 101 is shown as being mounted to a bottom of a processing chamber and not being configured to be rotated, the ESC 101 and other ESCs disclosed herein may be mounted to a bottom or a top of a processing chamber and may be configured as a spin chuck to be rotated during processing of a substrate. If mounted to a top of a processing chamber, the ESC may have similar configurations to that disclosed herein, but flipped upside down and may include peripheral substrate holding, clamping, and/or clasping hardware.

The substrate processing system 100 includes a processing chamber 104. The ESC 101 is enclosed within the processing chamber 104. The processing chamber 104 also encloses other components, such as an upper electrode 105, and contains RF plasma. During operation, a substrate 107 is arranged on and electrostatically clamped to the top plate 102 of the ESC 101.

For example only, the upper electrode 105 may include a showerhead 109 that introduces and distributes gases. The showerhead 109 may include a stem portion 111 including one end connected to a top surface of the processing chamber 104. The showerhead 109 is generally cylindrical and extends radially outward from an opposite end of the stem portion 111 at a location that is spaced from the top surface of the processing chamber 104. A substrate-facing surface or the showerhead 109 includes holes through which process or purge gas flows. Alternately, the upper electrode 105 may include a conducting plate and the gases may be introduced in another manner. One or both of the plates 102, 103 may perform as a lower electrode.

One or both of the plates 102, 103 may include temperature control elements (TCEs). As an example, FIG. 1 shows the top plate 102 including TCEs 110 and being used as a heating plate. An intermediate layer 114 is arranged between the plates 102, 103. The intermediate layer 114 may bond the top plate 102 to the baseplate 103. As an example, the intermediate layer may be formed of an adhesive material suitable for bonding the top plate 102 to the baseplate 103. The baseplate 103 may include one or more gas channels 115 and/or one or more coolant channels 116 for flowing backside gas to a backside of the substrate 107 and coolant through the baseplate 103.

An RF generating system 120 generates and outputs RF voltages to the upper electrode 105 and the lower electrode (e.g., one or more of the plates 102, 103). One of the upper electrode 105 and the ESC 101 may be DC grounded, AC grounded or at a floating potential. For example only, the RF generating system 120 may be controlled by a system controller 121 and include one or more RF generators 122 (e.g., a capacitive coupled plasma RF power generator, a bias power generator, and/or other RF power generator) that generate RF voltages, which are fed by one or more matching and distribution networks 124 to the upper electrode 105 and/or the ESC 101. As an example, a first RF generator 123, a second RF generator 125, a first RF matching network 127 and a second RF matching network 129 are shown. The first RF generator 123 and the first RF matching network 127 may provide a RF voltage or may simply connect the showerhead 109 to a ground reference. The second RF generator 125 and the second RF matching network 129 may each or collectively be referred to as a power source and provide a RF/bias voltage to the ESC 101. In one embodiment, the first RF generator 123 and the first RF matching network 127 provides power that ionizes gas and drives plasma. In another embodiment, the second RF generator 125 and the second RF matching network 129 provides power that ionizes gas and drives plasma. One of the RF generators 123, 125 may be a high-power RF generator producing, for example 6-10 kilo-watts (kW) of power or more.

The second RF matching network 129 includes impedances 128 and supplies power to RF electrodes, such as RF electrodes 131, 133 in the plates 102, 103. The RF electrodes may be located in one or both of the plates 102, 103. The RF electrodes may be located near an upper surface of the ESC 101, for example, when being used as clamping electrodes and/or in other locations in the ESC 101 when being used for biasing purposes. The RF electrodes may receive power alternatively or in addition from other power sources. As an example, some of the RF electrodes may receive power from a power source 135 instead of or in addition to receiving power from the second RF matching network 129. In one embodiment, the power source 135 does not include a matching network and/or no matching network is disposed between the power source 135 and the RF electrodes. Some of the RF electrodes may receive power from the second RF matching network 129 and/or the power source 135 to electrostatically clamp a substrate to the top plate 102. The power source 135 may be controlled by the system controller 121. Tuning circuits 139 may be connected (i) between the second RF matching network 129 and corresponding ones of the electrodes 131, 133, 137, and (ii) between the power source 135 and corresponding ones of the electrodes 131, 133, 137. In an embodiment, the tuning circuits 139 are disposed outside the processing chamber 104 separate from and downstream from the second RF matching network 129. Examples of the tuning circuits 139 are shown in FIGS. 2-11.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply etch gas, carrier gas and/or purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 104. For example only, the output of the manifold 140 is fed to the showerhead 109.

The substrate processing system 100 further includes a cooling system 141 that includes a temperature controller 142, which may be connected to the TCEs 110. In one embodiment, the TCEs 110 are not included. Although shown separately from a system controller 121, the temperature controller 142 may be implemented as part of the system controller 121. One or more of the plates 102, 103 may include multiple temperature controlled zones (e.g., 4 zones, where each of the zones includes 4 temperature sensors).

The temperature controller 142 may control operation and thus temperatures of the TCEs 110 to control temperatures of the plates 102, 103 and a substrate (e.g., the substrate 107). The temperature controller 142 and/or the system controller 121 may control flow rate of backside gas (e.g., helium) to the gas channels 115 for cooling the substrate by controlling flow from one or more of the gas sources 132 to the gas channels 115. The temperature controller 142 may also communicate with a coolant assembly 146 to control flow of a first coolant (pressures and flow rates of a cooling fluid) through the channels 116. The first coolant assembly 146 may receive a cooling fluid from a reservoir (not shown). For example, the coolant assembly 146 may include a coolant pump and reservoir. The temperature controller 142 operates the coolant assembly 146 to flow the coolant through the channels 116 to cool the baseplate 103. The temperature controller 142 may control the rate at which the coolant flows and a temperature of the coolant. The temperature controller 142 controls current supplied to the TCEs 110 and pressure and flow rates of gas and/or coolant supplied to channels 115, 116 based on detected parameters from sensors 143, 144 within the processing chamber 104. The sensors 143, 144 may include resistive temperature devices, thermocouples, digital temperature sensors, temperature probes, and/or other suitable temperature sensors. The sensors 143, 144 and/or other sensors included in the substrate processing system 100 may be used to detect parameters, such as temperatures, gas pressures, voltages, current levels, etc. During an etch process, the substrate 107 may be heated up by a predetermined temperature (e.g., 120 degrees Celsius (° C.)) in presence of high-power plasma. Flow of gas and/or coolant through the channels 115, 116 reduces temperatures of the baseplate 103, which reduces temperatures of the substrate 107 (e.g., cooling from 120° C. to 80° C.).

A valve 156 and pump 158 may be used to evacuate reactants from the processing chamber 104. The system controller 121 may control components of the substrate processing system 100 including controlling supplied RF power levels, pressures and flow rates of supplied gases, RF matching, etc. The system controller 121 controls states of the valve 156 and the pump 158. A robot 170 may be used to deliver substrates onto, and remove substrates from, the ESC 101. For example, the robot 170 may transfer substrates between the ESC 101 and a load lock 172. The robot 170 may be controlled by the system controller 121. The system controller 121 may control operation of the load lock 172.

The valves, gas and/or coolant pumps, power sources, RF generators, etc. may be referred to as actuators. The TCEs, gas channels, coolant channels, etc. may be referred to as temperature adjusting elements.

The system controller 121 may control states of impedances of the tuning circuits 139. Examples of the impedances are shown in FIGS. 7-11. The impedances of the tuning circuits 139 may be adjusted based on feedback signals received from the sensors 143, 144, 145 and/or other sensors in the substrate support 101, the processing chamber 104, the second RF matching network 129, and/or in one or more of the power sources 125, 135. The sensors 145 may detect voltages, current levels, power levels in the second RF matching network 129. Although the sensors are shown in the baseplate 103, one or more of the sensors may be located in the top plate 102. The sensors 104 may be located anywhere in the substrate support 101. The sensors 143 may be located anywhere in the processing chamber 104.

The system controller 121 may also control states of the impedances 128. The states of the impedances 128 may be set, such that one or more impedances of one or more outputs of the second RF matching network 129 matches impedances seen at inputs of the tuning circuits 139. The impedances seen at the inputs of the tuning circuits 139 are based on impedances of the substrate support 101 and the tuning circuits 139. When adjusting the impedances of the tuning circuits 139, the system controller 121 may also adjust impedances of the second RF matching network 129 accordingly.

Although in the following described FIGS. 2-11 a certain number of tuning circuits, impedances, clamping electrodes, RF electrodes, and/or other elements are shown, any number of each may be included. Also, although the tuning circuits, impedances, clamping electrodes and RF electrodes are shown in certain arrangements and having certain sizes, shapes, and patterns, the stated elements may be in different arrangements and have different sizes, shapes, and patterns.

Figure 2:
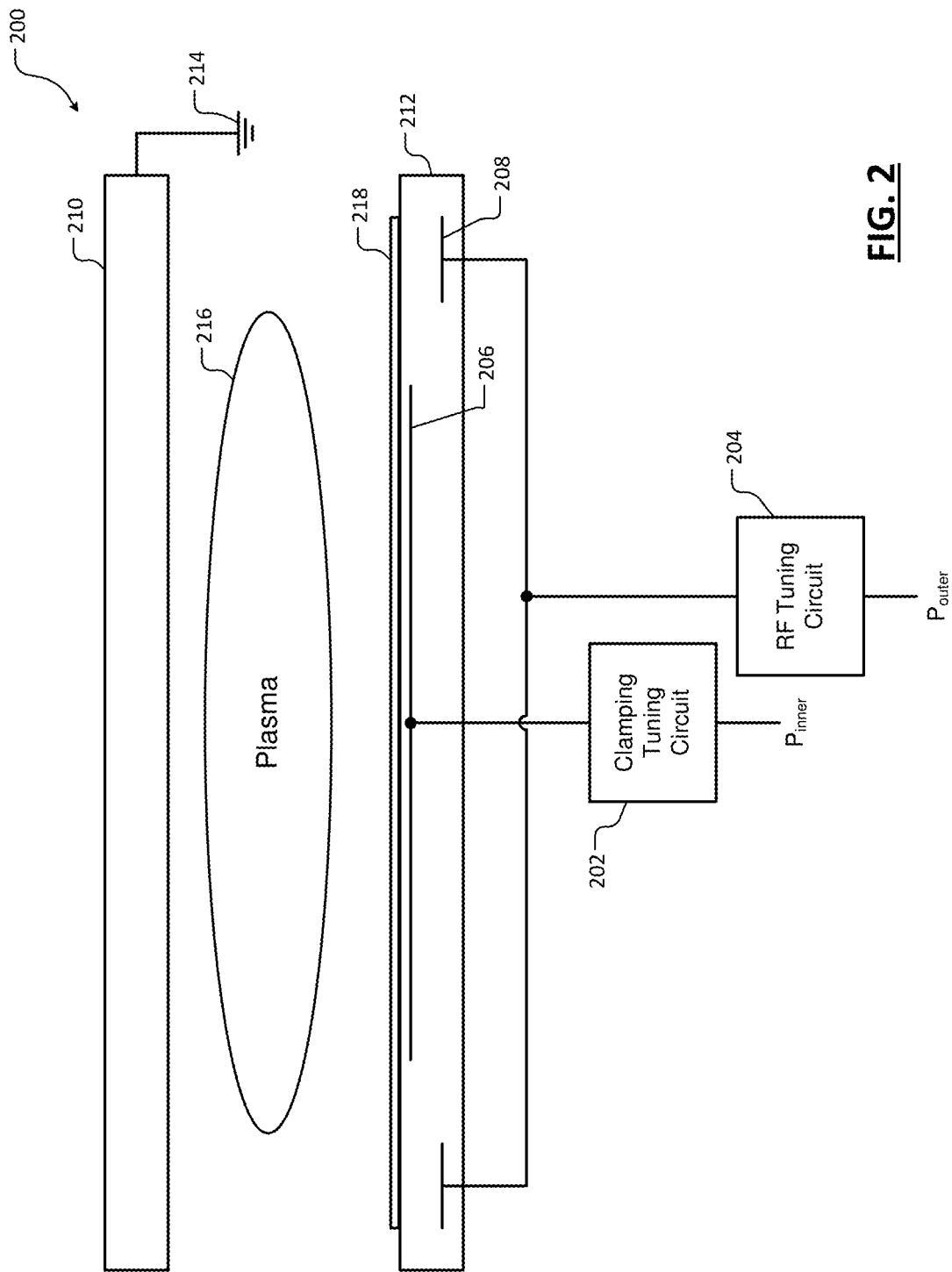
FIG. 2 is a functional block diagram of an example capacitive coupling circuit including tuning circuits for a clamping electrode and a bias electrode in accordance with an embodiment of the present disclosure.

FIG. 2 shows a capacitive coupling circuit 200 including a clamping tuning circuit 202, a RF tuning circuit 204, a clamping electrode 206 and a RF electrode 208. Cross-sectional views of a showerhead (or upper electrode) 210 and an ESC 212 are shown. The showerhead 210 may be connected to a reference potential or ground 214. In an embodiment, the showerhead 210 is RF powered by the first RF matching network 127 of FIG. 1. Plasma 216 is provided between the showerhead 210 and the ESC 212. A substrate 218 is disposed on the ESC 212.

Figure 6:
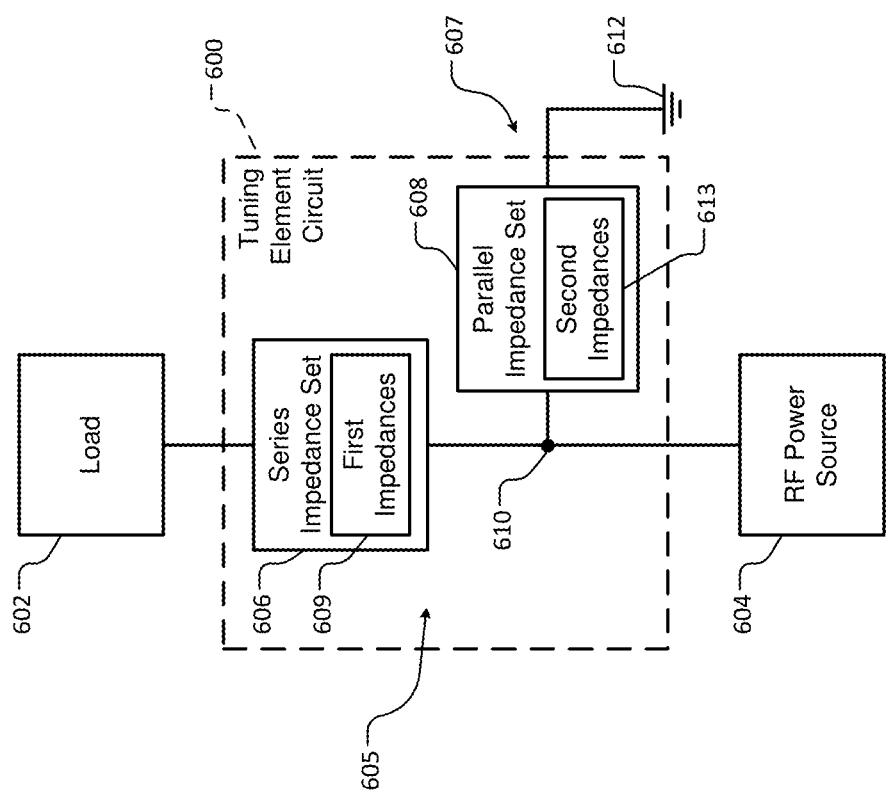
FIG. 6 is a functional block diagram of an example of a tuning circuit for a clamping electrode and a bias electrode in accordance with an embodiment of the present disclosure.

The clamping tuning circuit 202 may be used to control clamping voltages, current levels, phases, power levels and/or frequencies provided to the clamping electrode 206. The RF tuning circuit 204 may be used to control bias voltages, current levels, power levels and/or frequencies provided to the RF electrode 208. The tuning circuits 202, 204 may receive power $P_{inner}$, $P_{outer}$ from, for example, the second RF matching network 129 (or first power source) and/or the power source 135 (or second power source) of FIG. 1 and be used to adjust voltage drops across plasma. This may include adjusting voltage differences between respective pairs of points above and across a surface of the substrate support 101 of FIG. 1. Examples of the tuning circuits 202, 204 are shown in FIG. 6. The tuning circuits 202, 204 may include one or more of the impedances, as shown in FIG. 6. The tuning circuits 202, 204 may not include a parallel impedance path or may include a transmission line instead of a serial impedance path. Example parallel and serial impedance paths are shown in FIG. 6. Examples of the impedances that may be included in the tuning circuits 202, 204 are shown in FIGS. 7-11. The impedances may be serial or parallel connected, may be shunt impedances, and/or may include capacitors, inductors, resistors, reactances, transmission lines, shorted or open circuit, filtering elements (or filters) and/or other impedances. As an example, the clamping electrode 206 may be circular-shaped and the RF electrode 208 may be annular-shaped.

Figure 3:
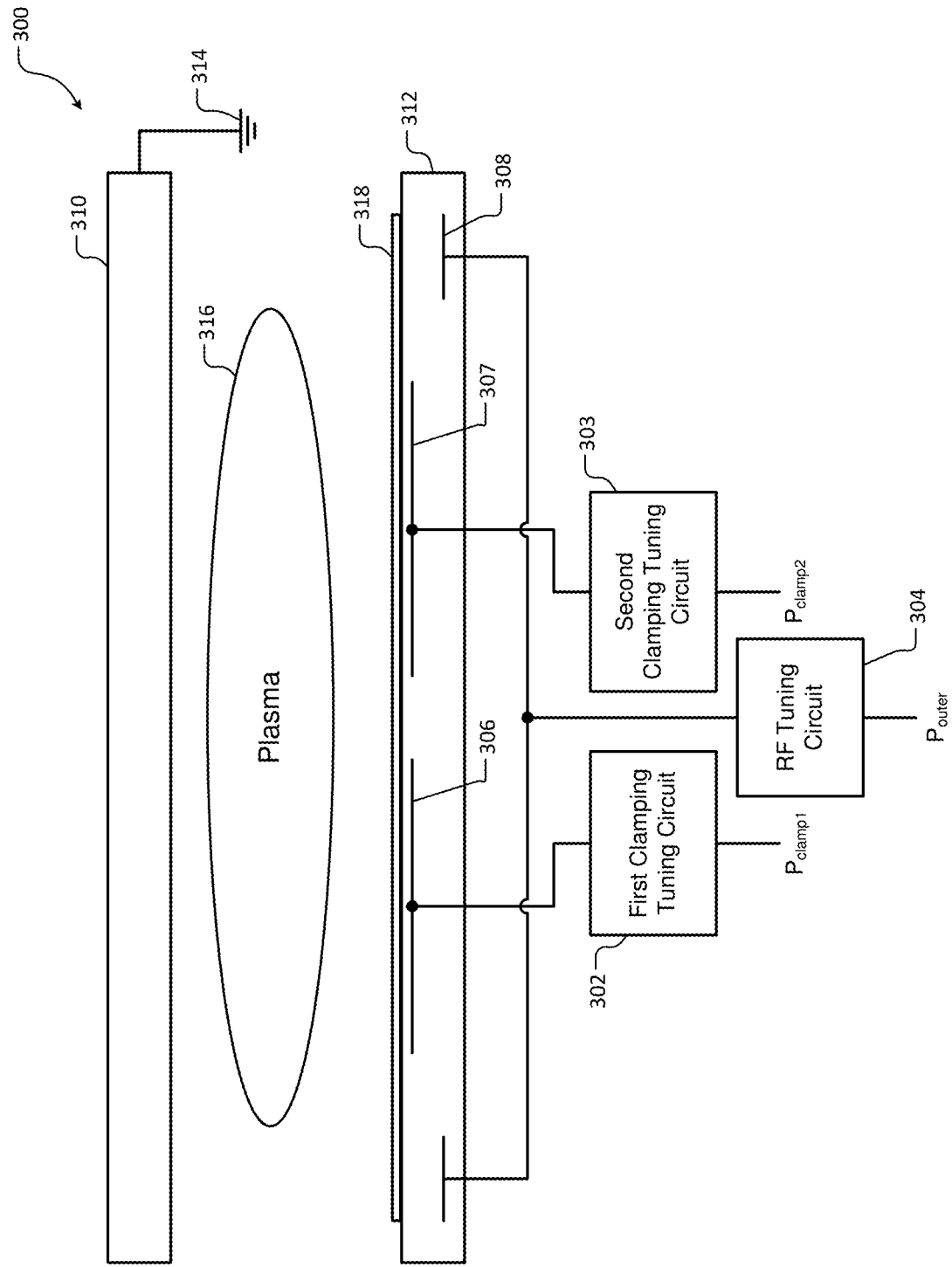
FIG. 3 is a functional block diagram of an example of a capacitive coupling circuit including tuning circuits for two clamping electrodes and a bias electrode in accordance with an embodiment of the present disclosure.

FIG. 3 shows a capacitive coupling circuit 300 including a first clamping tuning circuit 302, a second clamping tuning circuit 303, an outer RF tuning circuit 304, a first clamping electrode 306, a second clamping electrode 307 and a RF electrode 308. Cross-sectional views of a showerhead (or upper electrode) 310 and an ESC 312 are shown. The showerhead 310 may be connected to a reference potential or ground 314. In an embodiment, the showerhead 310 is RF powered by the first RF matching network 127 of FIG. 1. Plasma 316 is provided between the showerhead 310 and the ESC 312. A substrate 318 is disposed on the ESC 312.

The clamping tuning circuits 302, 303 may be used to control clamping voltages, current levels, power levels and/or frequencies provided to the clamping electrodes 306, 307. The RF tuning circuit 304 may be used to control bias voltages, current levels, power levels and/or frequencies provided to the RF electrode 308. The tuning circuits 302, 303, and 304 may receive power $P_{clamp1}$, $P_{clamp2}$, and $P_{outer}$ from, for example, the second RF matching network 129 (or first power source) of FIG. 1, the power source 135 (or second power source) of FIG. 1, and/or from one or more other power sources. The tuning circuits 302, 303, 304 may be used to adjust voltage drops across plasma. In one embodiment, $P_{clamp1}$ is equal to $P_{clamp2}$. Examples of the tuning circuits 302, 303, 304 are shown in FIG. 6. The tuning circuits 302, 303, 304 may include one or more of the impedances, as shown in FIG. 6. The tuning circuits 302, 303, 304 may not include a parallel impedance path or may include a transmission line instead of a serial impedance path. Examples of the impedances that may be included in the tuning circuits 302, 303, 304 are shown in FIGS. 7-11. The impedances may be serial or parallel connected, may be shunt impedances, and/or may include capacitors, inductors, resistors, reactances, transmission lines, shorted or open circuit, filtering elements and/or other impedances. As an example, the clamping electrodes 306, 307 may be circular-shaped and the RF electrode 308 may be annular-shaped.

Figure 4:
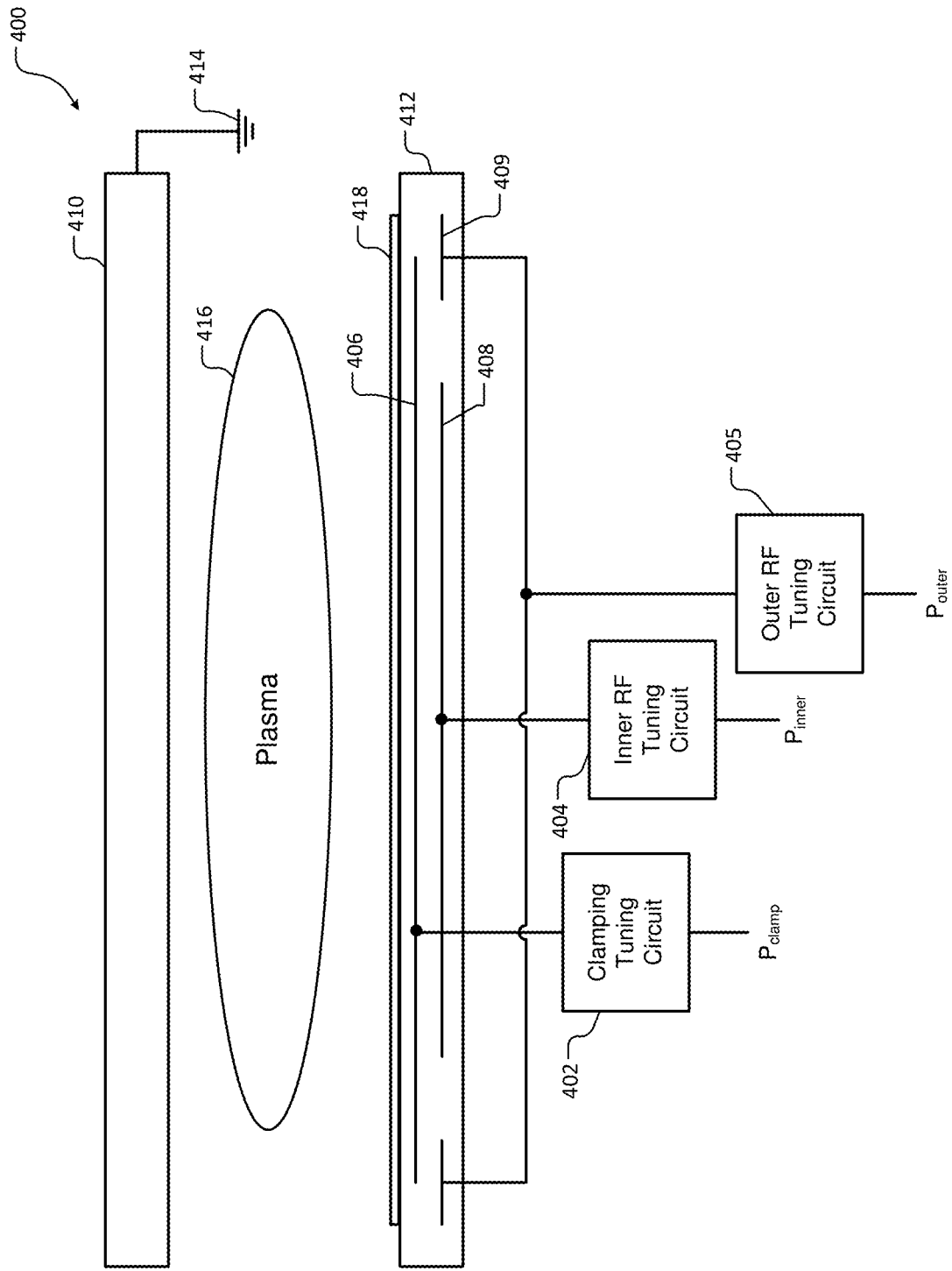
FIG. 4 is a functional block diagram of an example of a capacitive coupling circuit including tuning circuits for a clamping electrode and two bias electrodes in accordance with an embodiment of the present disclosure.

FIG. 4 shows a capacitive coupling circuit 400 that includes a clamping tuning circuit 402, an inner RF tuning circuit 404, an outer RF tuning circuit 405, a clamping electrode 406, an inner bias electrode 408 and an outer bias electrode 409. Cross-sectional views of a showerhead (or upper electrode) 410 and an ESC 412 are shown. The showerhead 410 may be connected to a reference potential or ground 414. In an embodiment, the showerhead 410 is RF powered by the first RF matching network 127 of FIG. 1. Plasma 416 is provided between the showerhead 410 and the ESC 412. A substrate 418 is disposed on the ESC 412.

The clamping tuning circuit 402 may be used to control clamping voltages, current levels, phases, power levels and/or frequencies provided to the clamping electrode 406. The RF tuning circuits 404, 405 may be used to control bias voltages, current levels, power levels and/or frequencies provided to the bias electrodes 408, 409. The tuning circuits 402, 404, 405 may receive power $P_{clamp}$, $P_{inner}$, $P_{outer}$ from, for example, the second RF matching network 129 (or first power source) of FIG. 1, the power source 135 (or second power source) of FIG. 1, and/or from one or more other power sources. The tuning circuits 402, 404, 405 may be used to adjust voltage drops across plasma. Examples of the tuning circuits 402, 404, 405 are shown in FIG. 6. The tuning circuits 402, 404, 405 may include one or more of the impedances, as shown in FIG. 6. The tuning circuits 402, 404, 405 may not include a parallel impedance path or may include a transmission line instead of a serial impedance path. Examples of the impedances that may be included in the tuning circuits 402, 404, 405 are shown in FIGS. 7-11. The impedances may be serial or parallel connected, may be shunt impedances, and/or may include capacitors, inductors, resistors, reactances, transmission lines, shorted or open circuit, filtering elements and/or other impedances. As an example, the clamping electrode 406 and the inner bias electrode 408 may be circular-shaped and the outer bias electrode 409 may be annular-shaped.

Figure 5:
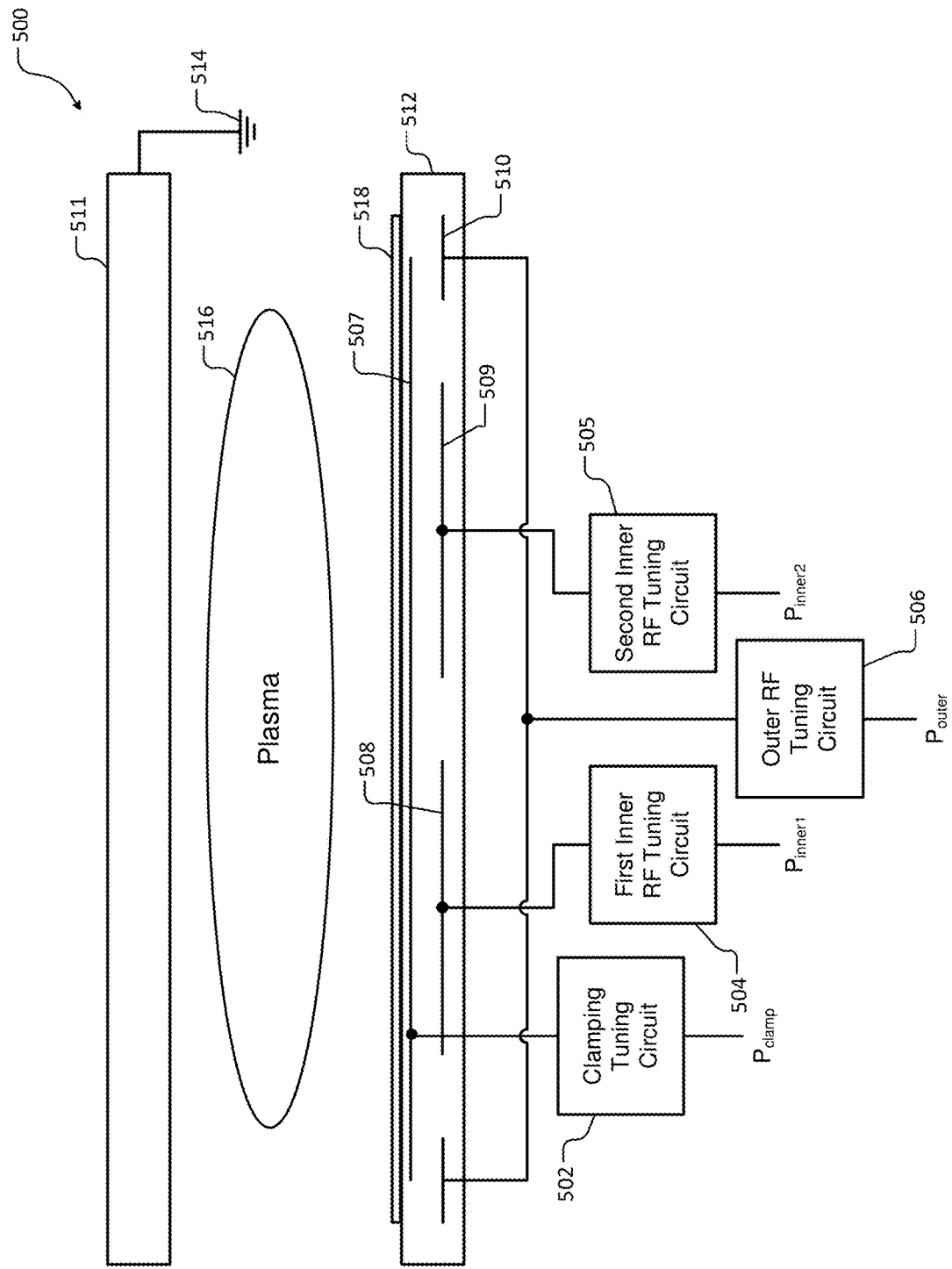
FIG. 5 is a functional block diagram of an example of a capacitive coupling circuit including tuning circuits for a clamping electrode and three bias electrodes in accordance with an embodiment of the present disclosure.

FIG. 5 shows a capacitive coupling circuit 500 including a clamping tuning circuit 502, a first inner RF tuning circuit 504, a second inner tuning circuit 505, an outer RF tuning circuit 506, a clamping electrode 507, a first inner bias electrode 508, a second inner bias electrode 509, and an outer bias electrode 510. Cross-sectional views of a showerhead (or upper electrode) 511 and an ESC 512 are shown. The showerhead 511 may be connected to a reference potential or ground 514. In an embodiment, the showerhead 511 is RF powered by the first RF matching network 127 of FIG. 1. Plasma 516 is provided between the showerhead 511 and the ESC 512. A substrate 518 is disposed on the ESC 512.

The clamping tuning circuit 502 may be used to control clamping voltages, current levels, power levels and/or frequencies provided to the clamping electrode 507. The RF tuning circuits 504, 505, 506 may be used to control bias voltages, current levels, phases, power levels and/or frequencies provided to the bias electrodes 508, 509, 510. The tuning circuits 502, 504, 505, 506 may receive power $P_{clamp}$, $P_{inner1}$, $P_{inner2}$, $P_{outer}$ from, for example, the second RF matching network 129 (or first power source) of FIG. 1, the power source 135 (or second power source) of FIG. 1, and/or from one or more other power sources. The tuning circuits 502, 504, 505, 506 may be used to adjust voltage drops across plasma. Examples of the tuning circuits 502, 504, 505, 506 are shown in FIG. 6. The tuning circuits 502, 504, 505, 506 may include one or more of the impedances, as shown in FIG. 6. The tuning circuits 502, 504, 505, 506 may not include a parallel impedance path or may include a transmission line instead of a serial impedance path. Examples of the impedances that may be included in the tuning circuits 502, 504, 505, 506 are shown in FIGS. 7-11. The impedances may be serial or parallel connected, may be shunt reactances, and/or may include capacitors, inductors, resistors, reactances, transmission lines, shorted or open circuit, filtering elements and/or other impedances. As an example, the clamping electrode 507 and the bias electrodes 508, 509 may be circular-shaped and the outer bias electrode 510 may be annular-shaped.

Figure 9:
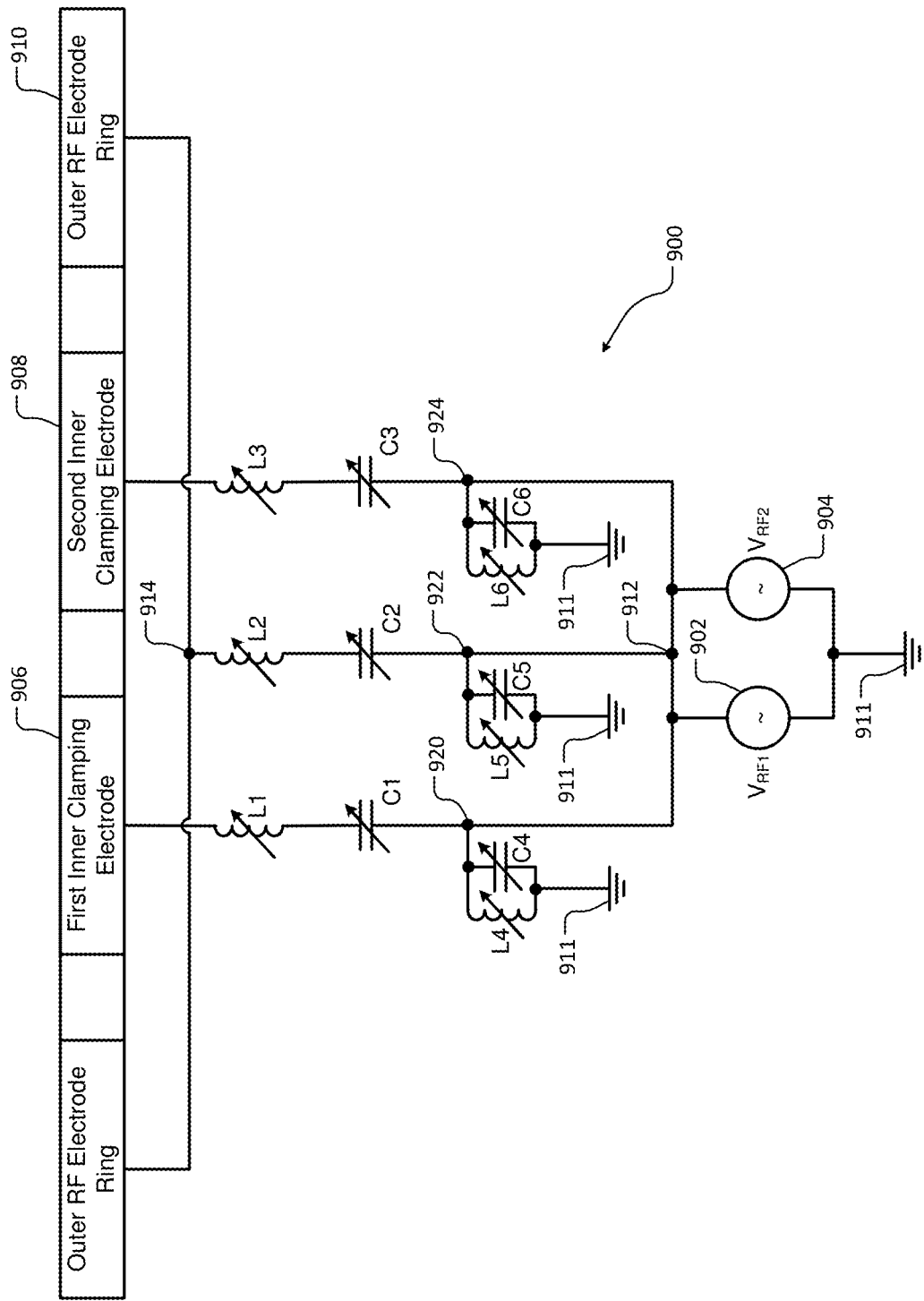
FIG. 9 is a functional block and schematic diagram of an example of a tuning circuit connected to dual RF power sources and including serially connected inductors and capacitors and shunt inductors and capacitors for two clamping electrodes and a bias electrode ring in accordance with an embodiment of the present disclosure.
Figure 10:
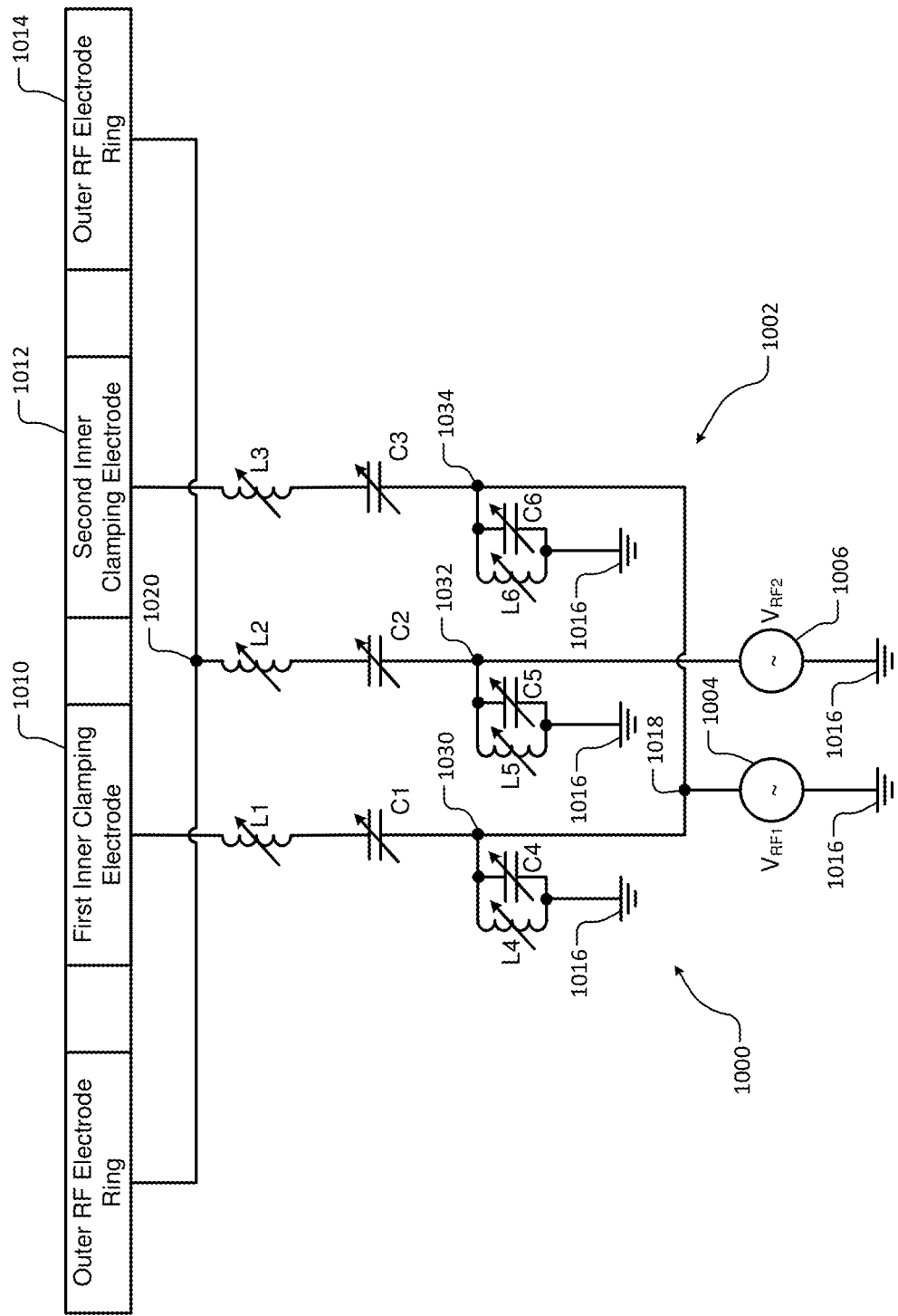
FIG. 10 is a functional block and schematic diagram of an example of two tuning circuits connected to respective RF power sources and including serially connected inductors and capacitors or shunt inductors and capacitors for two clamping electrodes and a bias electrode ring in accordance with an embodiment of the present disclosure.

FIG. 6 shows a tuning circuit 600 for an electrode (or load) 602, such as a clamping electrode or a bias electrode. The tuning circuit 600 may replace any of the tuning circuits 202, 204, 302, 304, 305, 402, 404, 405, 502, 504, 505, and 506 of FIGS. 2-5. Examples of the tuning circuit 600 are shown in FIGS. 9-10. The tuning circuit 600 may receive RF power from a RF power source 604, such as one of the power sources 129, 135 of FIG. 1. The tuning circuit 600 may include a serial impedance path 605 with a series impedance set 606 and a parallel impedance path 607 with a parallel impedance set 608. The series impedance set 606 includes one or more impedances 609 connected in series between the RF power source 604 and the load 602. The series impedance set 606 and the one or more impedances 609 are connected between the load 602 and a source terminal 610. The source terminal 610 is connected to the RF power source 604. The parallel impedance set 608 is connected between (i) the source terminal 610 that is connected between the RF power source 604 and the series impedance set 606, and (ii) a reference terminal or ground 612. The parallel impedance set 608 may include one or more impedances 613 connected in parallel between the source terminal 610 and the reference terminal 612.

One or more of the impedances 609, 613 may be fixed impedances. In addition or alternatively, one or more of the impedances 609, 613 may be variable impedances, which may be adjusted by the system controller 121 of FIG. 1 based on, for example: a current processing recipe; current operating parameters; parameters measured and/or determined based on outputs of one or more sensors (e.g., the sensors 143 of FIG. 1); and/or processing system, ESC and substrate features and/or characteristics.

Although in the following FIGS. 7-11, certain impedances are shown, other impedances may be included. The impedances may include "stray" inductance from wires and/or other conductive circuit elements.

Figure 7:
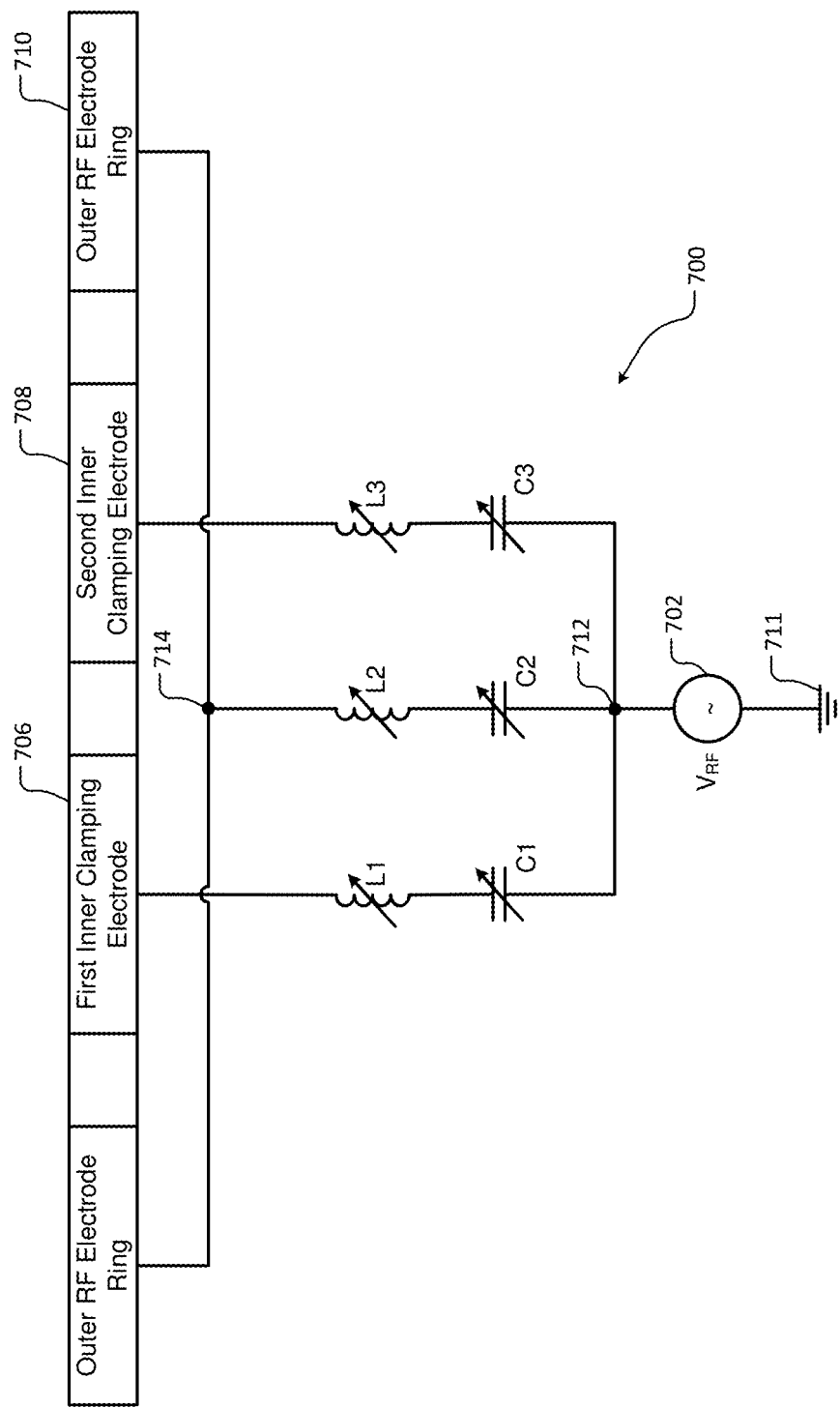
FIG. 7 is a functional block and schematic diagram of an example of a tuning circuit connected to a single RF power source and including serially connected inductors and capacitors for two clamping electrodes and a bias electrode ring in accordance with an embodiment of the present disclosure.

FIG. 7 shows a tuning circuit 700 may be connected to a single RF power source 702. The tuning circuit 700 includes serially connected inductors L1-L3 and capacitors C1-C3 for two clamping electrodes 706, 708 and a bias electrode ring 710. The RF power source 702 may operate similarly to the power sources 129, 135 of FIG. 1 and may be connected to a reference terminal or ground 711. In one embodiment (referred to as a grounded pedestal configuration), the RF power source 702 is not included and the capacitors C1-C3 are connected to the ground 711.

In FIG. 7, cross-sectional views of the electrodes 706, 708, 710 are shown. The electrodes 706, 708, 710 may be concentrically disposed. L1 and C1 are connected in series between (i) the RF power source 702 and a common terminal 712, and (ii) the first inner clamping electrode 706. L2 and C2 are connected in series between (i) the RF power source 702 and a common (or source) terminal 712, and (ii) and a central terminal 714, which is connected to two points on the bias electrode ring 710. L3 and C3 are connected in series between (i) the RF power source 702 and a common terminal 712, and (ii) and the second inner clamping electrode 708.

The inductors L1-L3 and capacitors C1-C3 may have fixed values or may be variable devices that are controlled by the system controller 121 of FIG. 1, as described above. Although inductors L1-L3 and capacitors C1-C3 are shown, other impedances may be incorporated in the tuning circuit 700.

FIG. 7 provides an example of when power is provided to a common node (or terminal) and split to provide power to multiple electrodes. The impedance of each path to each electrode may be altered by the impedances (or serially connected inductances and capacitances) in the corresponding path.

Figure 8:
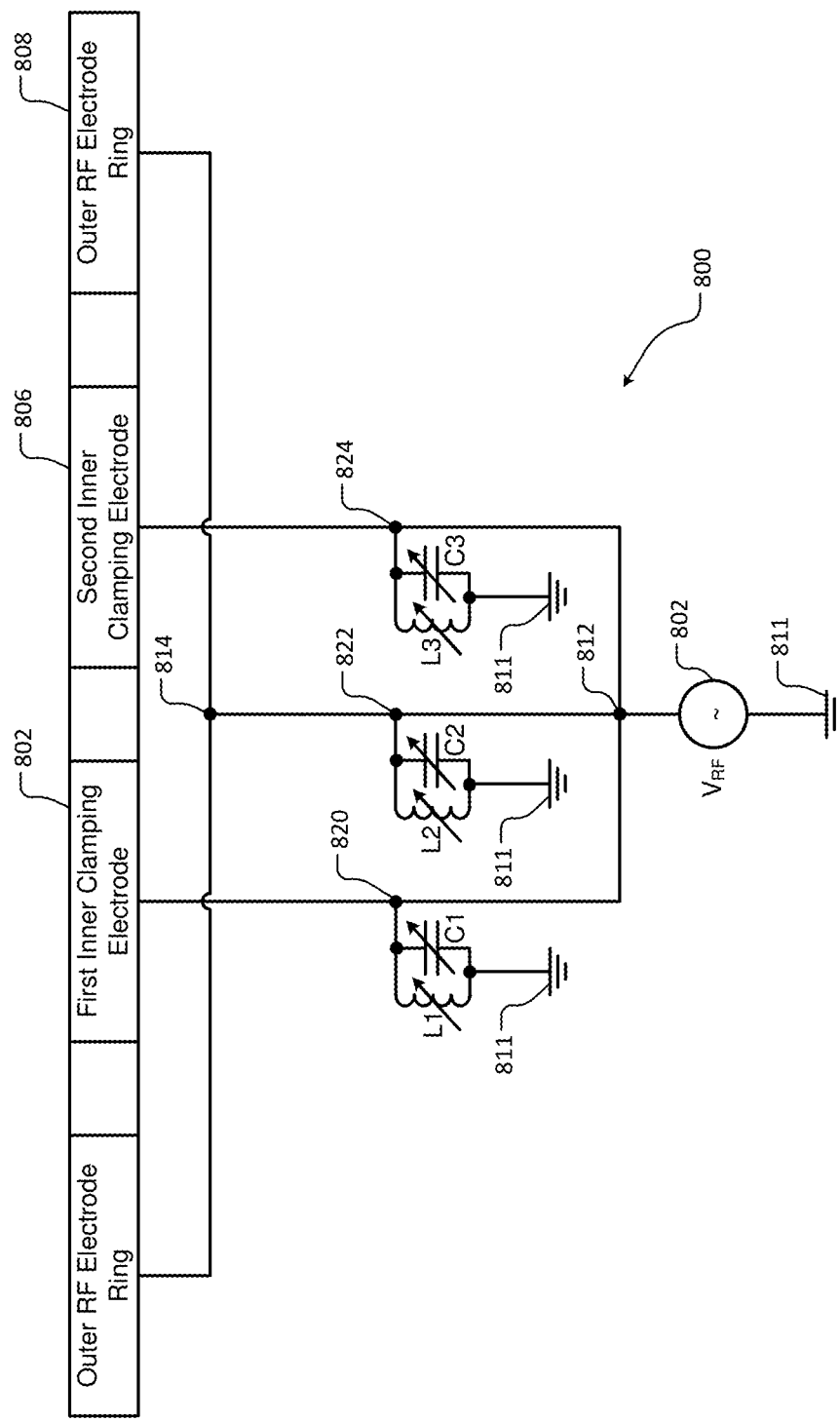
FIG. 8 is a functional block and schematic diagram of an example of a tuning circuit connected to a single RF power source and including shunt inductors and capacitors for two clamping electrodes and a bias electrode ring in accordance with an embodiment of the present disclosure.

FIG. 8 shows a tuning circuit 800 may be connected to a single RF power source 802. The tuning circuit 800 includes shunt inductors L1-L3 and shunt capacitors C1-C3 for two clamping electrodes 804, 806 and a bias electrode ring 808. The RF power source 802 may operate similarly to the power sources 129, 135 of FIG. 1 and may be connected to a reference terminal or ground 811. The RF power source 802 is connected to a common (or source) terminal 812, which is connected to the clamping electrodes 802, 806 and to a central terminal 814.

In one embodiment (referred to as a grounded pedestal configuration), the RF power source 802 is not included and the terminal 812 is connected to the ground 811. When the terminal 812 is connected to the ground 811, one or more serially connected impedances may be connected (i) between the node 820 and the ground 811, (ii) between the node 822 and the ground 811, and/or between the node 824 and the ground 811. The stated one or more serially connected impedances may be similar to the impedances L1-L3 and C1-C3 or may include other impedances. This may occur, for example, when a corresponding showerhead is provided with RF power.

Cross-sectional views of the electrodes 802, 806, 808 are shown. The electrodes 802, 806, 808 may be concentrically disposed. L1 and C1 are connected in parallel between a first terminal 820 and the ground 811. The first terminal 820 is connected between the common terminal 812 and the first clamping electrode 802. L2 and C2 are connected in parallel between a second terminal 822 and the ground 811. The second terminal 822 is connected between the common terminal 812 and the first clamping electrode 802. L3 and C3 are connected in parallel between a third terminal 824 and the ground 811. The third terminal 824 is connected between the common terminal 812 and the second clamping electrode 806.

The inductors L1-L3 and capacitors C1-C3 may have arbitrary and/or predetermined fixed values or may be variable devices that are controlled by the system controller 121 of FIG. 1, as described above. Although inductors L1-L3 and capacitors C1-C3 are shown, other impedances may be incorporated in the tuning circuit 800.

FIG. 8 provides another example of when power is provided to a common node and split to provide power to multiple electrodes. The impedance of each path to each electrode may be altered by the shunt impedances (or shunt inductances and capacitances) connected to the corresponding path.

FIG. 9 shows a tuning circuit 900 connected to dual RF power sources 902, 904. The tuning circuit 900 includes serially connected inductors L1-L3 and capacitors C1-C3 and shunt inductors L4-L6 and capacitors C4-C6 for two clamping electrodes 906, 908 and a bias electrode ring 910.

The RF power sources 902, 904 may operate similarly to the power sources 129, 135 of FIG. 1 and may be connected to a reference terminal or ground 911. The RF power sources 902, 904 are connected to a common (or source) terminal 912 and may provide power at a same frequency or at different frequencies.

In one embodiment (referred to as a grounded pedestal configuration), the RF power sources 902, 904 are not included and the terminal 912 is connected to the ground 911. When the terminal 912 is connected to the ground 911, one or more serially connected impedances may be connected (i) between the node 920 and the ground 911, (ii) between the node 922 and the ground 911, and/or between the node 924 and the ground 911. The stated one or more serially connected impedances may be similar to the impedances L1-L3 and C1-C3 or may include other impedances. This may occur, for example, when a corresponding showerhead is provided with RF power.

The inductor L1 and capacitor C1 are connected in series between the common terminal 912 and the first clamping electrode 906. The inductor L2 and the capacitor C2 are connected in series between a central terminal 914 and the common terminal 912. The central terminal is connected to two points on the bias electrode ring 910.

Cross-sectional views of the electrodes 906, 908, 910 are shown. The electrodes 906, 908, 910 may be concentrically disposed. L4 and C4 are connected in parallel between a first terminal 920 and the ground 911. The first terminal 920 is connected between capacitor C1 and the common terminal 912. L5 and C5 are connected in parallel between a second terminal 922 and the ground 911. The second terminal 922 is connected between the capacitor C2 and the common terminal 912. L6 and C6 are connected in parallel between a third terminal 924 and the ground 911. The third terminal 924 is connected between the capacitor C3 and the common terminal 912.

The inductors L1-L6 and capacitors C1-C6 may have arbitrary and/or predetermined fixed values or may be variable devices that are controlled by the system controller 121 of FIG. 1, as described above. Although inductors L1-L6 and capacitors C1-C6 are shown, other impedances may be incorporated in the tuning circuit 900. L4-L6 and C4-C6 may be arbitrary networks, which may not include inductors and/or capacitors.

FIG. 10 shows two tuning circuits 1000, 1002 may be connected to respective RF power sources 1004, 1006. The first tuning circuit 1000 includes serially connected inductors L1, L3 and capacitors C1, C3 and shunt inductors L4, L6 and capacitors C4, C6 for two clamping electrodes 1010, 1012. The second tuning circuit 1002 includes serially connected inductor L2 and capacitor C2 and shunt inductor L5 and capacitor C5 for a bias electrode ring 1014. The RF power sources 1004, 1006 may operate similarly to the power sources 129, 135 of FIG. 1 and may be connected to a reference terminal or ground 1016. The RF power source 1004 is connected to a common (or source) terminal 1018, which is connected to C1, C3, C4, C6, L4, L6. The RF power source 1006 is connected to a central terminal 1020 via C2 and L2. The RF power sources 1004, 1006 may provide power at a same frequency or at different frequencies.

The inductor L1 and capacitor C1 are connected in series between the common terminal 1018 and the first clamping electrode 1010. The inductor L2 and the capacitor C2 are connected in series between a central terminal 1020 and RF power source 1006. The central terminal 1020 is connected to two points on the bias electrode ring 1014.

Cross-sectional views of the electrodes 1010, 1012, 1014 are shown. The electrodes 1010, 1012, 1014 may be concentrically disposed. L4 and C4 are connected in parallel between a first terminal 1030 and the ground 1016. The first terminal 1030 is connected between capacitor C1 and the common terminal 1018. L5 and C5 are connected in parallel between a second terminal 1032 and the ground 1016. The second terminal 1032 is connected between the capacitor C2 and the common terminal 1018. L6 and C6 are connected in parallel between a third terminal 1034 and the ground 1016. The third terminal 1034 is connected between the capacitor C3 and the common terminal 1018.

The inductors L1-L6 and capacitors C1-C6 may have arbitrary and/or predetermined fixed values or may be variable devices that are controlled by the system controller 121 of FIG. 1, as described above. Although inductors L1-L6 and capacitors C1-C6 are shown, other impedances may be incorporated in the tuning circuit 1000. L4-L6 and C4-C6 may be arbitrary networks, which may not include inductors and/or capacitors.

In one embodiment, the RF power source 1004 is not included and the terminal 1018 is connected to the ground 1016. In another embodiment, the RF power source 1006 is not included and the terminal 1032 is connected to the ground 1016. In yet another embodiment, neither of the RF power sources 1004, 1006 are included and both of the terminals 1018 and 1032 are connected to the ground 1016. When the terminal 1018 and/or the terminal 1032 is connected to the ground 1016, one or more serially connected impedances may be connected (i) between the node 1030 and the ground 1016, (ii) between the node 1034 and the ground 1016, and/or between the node 1032 and the ground 1016. The stated one or more serially connected impedances may be similar to the impedances L1-L3 and C1-C3 or may include other impedances. This may occur, for example, when a corresponding showerhead is provided with RF power.

Figure 11:
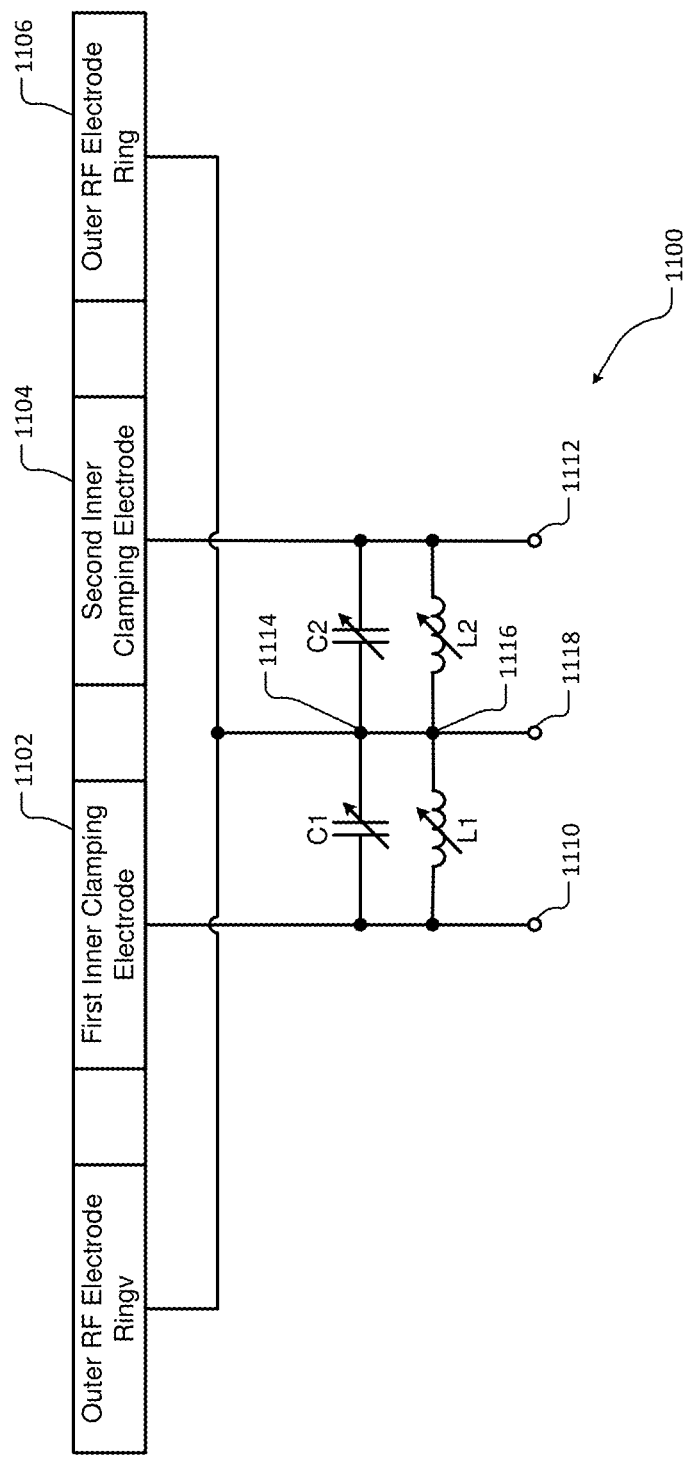
FIG. 11 is a functional block and schematic diagram of an example of a tuning circuit including parallel connected capacitors and inductors for two clamping electrodes and a bias electrode ring in accordance with an embodiment of the present disclosure.

FIG. 11 shows a tuning circuit 1100 including parallel connected capacitors C1, C2 and inductors L1, L2 for two clamping electrodes 1102, 1104 and a bias electrode ring 1106. The electrodes 1102, 1104, 1106 may be concentrically disposed. The capacitors C1 and C2 are connected in series (i) between the clamping electrodes 1102, 1104, and (ii) between power source terminals 1110, 1112. The inductors L1, L2 are connected in parallel respectively with the capacitors C1, C2 and in series (i) between the clamping electrodes 1102, 1104, and (ii) between power source terminals 1110, 1112. Center terminals 1114, 1116 are connected respectively between the capacitors C1, C2 and between the inductors L1, L2. The center terminals 1114, 1116 are connected to both (i) two points on the bias electrode ring 1106, and (ii) a third (or center) power source terminal 1118. The power source terminals 1110, 1112 are connected respectively to the clamping electrodes 1102, 1104. The power source terminals 1110, 1112, 1118 may be connected to respective power sources. In one embodiment, one or more of the power source terminals 1110, 1112, 1118 are not connected to a RF power source, but rather are connected to a reference terminal or ground.

The inductors L1-L2 and capacitors C1-C2 may have arbitrary and/or predetermined fixed values or may be variable devices that are controlled by the system controller 121 of FIG. 1, as described above. Although inductors L1-L2 and capacitors C1-C2 are shown, other impedances may be incorporated in the tuning circuit 1100. The inductors L1-L2 and the capacitors C1-C2 are coupling elements connected between electrodes to provide power at multiple frequencies to each electrode.

The tuning circuit 1100 may be used in combination with any of the circuits shown in FIGS. 3, 5 and 7-10. For example, the capacitors C1, C2 and the inductors L1, L2 may be similarly connected to: the electrodes 306, 307 and electrode ring 308 of FIG. 3; the electrodes 508, 509 and electrode ring 510 of FIG. 5; the electrodes 706, 708 and electrode ring 710 of FIG. 7; the electrodes 802, 806 and electrode ring 808 of FIG. 8; the electrodes 906, 908 and electrode ring 910 of FIG. 9; and the electrodes 1010, 1012 and electrode ring 1014 of FIG. 10.

In the above-provided examples of FIGS. 2-11, if power is provided at multiple frequencies, the paths to a given electrode may include frequency dependent filtering elements to provide power at a particular frequency to that electrode. The above-described impedances may include the frequency dependent filtering elements. In addition, the power provided to different electrodes may be provided by separate (or different) power sources that operate at a same frequency or at different frequencies, such that the power provided by the power sources is at a same frequency or at different frequencies. FIGS. 9-10 show examples including multiple power sources. As an alternative, one or more of the power sources may not be included and the corresponding terminals (e.g., terminals 912, 1018, 1032) may be connected to a reference terminal or a ground.

Figure 12:
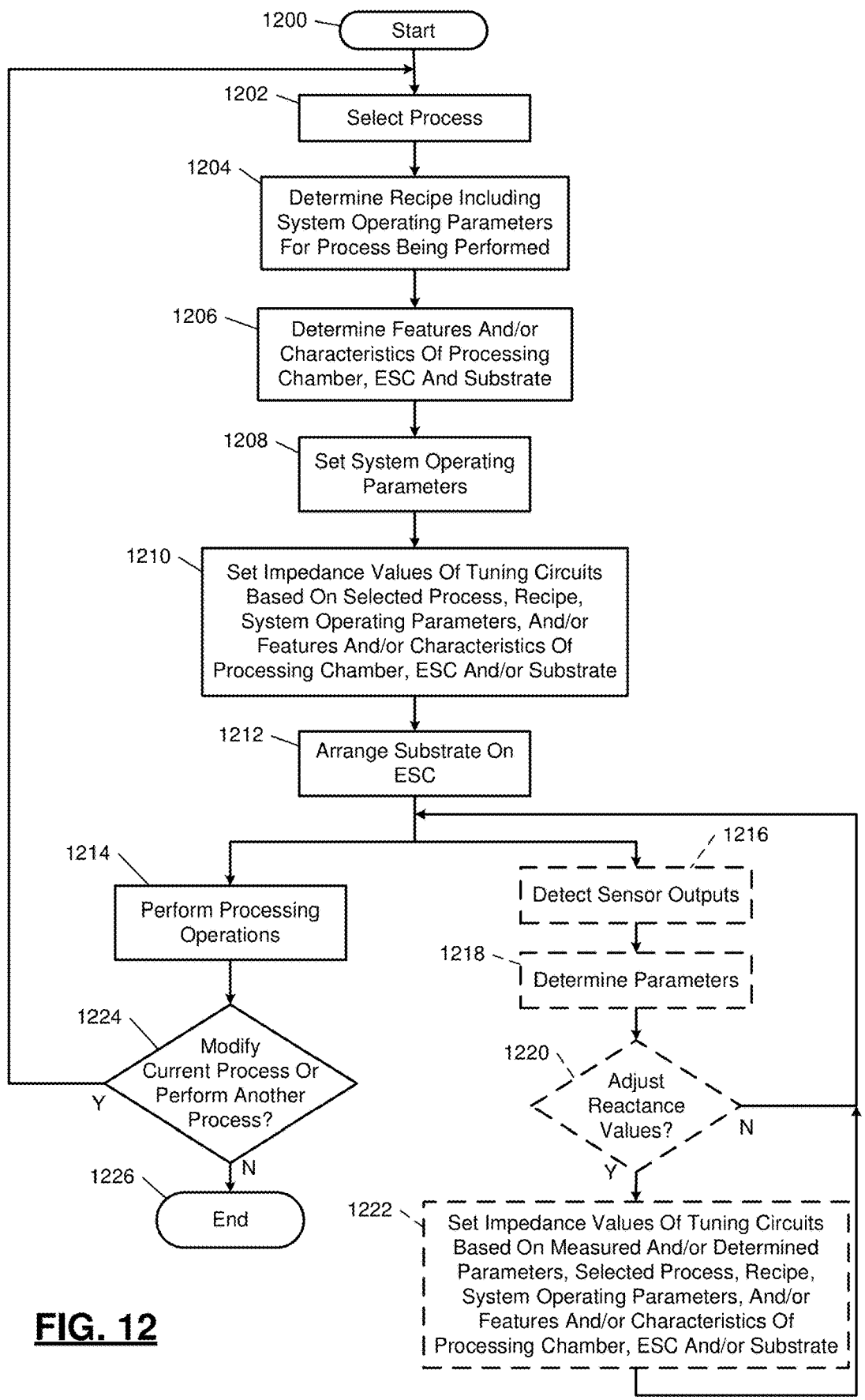
FIG. 12 illustrates a method of operating a substrate processing system including setting and adjusting impedance values for tuning circuits of electrodes of an electrostatic chuck in accordance with an embodiment of the present disclosure.

FIG. 12 shows an example method of operating a substrate processing system including setting and adjusting impedance values for tuning circuits of electrodes of an electrostatic chuck. Although the following operations are primarily described with respect to the implementations of FIGS. 1-11, the operations may be easily modified to apply to other implementations of the present disclosure. The operations may be iteratively performed. The operations may be performed by, for example, the system controller 121 of FIG. 1.

The method may begin at 1200. At 1202, a process to be performed is selected. Example processes are a cleaning process, an etching process, a deposition process, an annealing process, etc. At 1204, a recipe including system operating parameters are determined for the selected process being performed. Example system operating parameters are: gas pressures and flow rates; processing chamber, ESC and substrate temperatures; RF bias voltages; clamping voltages; electrode voltages, current levels, power levels, and/or frequencies; etc.

At 1206, features and/or characteristics of the processing chamber, ESC and substrate are determined. Example features and characteristics are processing chamber geometry values, makeup of the ESC, heating and cooling characteristics (e.g., heating and cooling rates) of the ESC, size of the ESC, makeup of the substrate, materials of the ESC and/or substrate, etc.

At 1208, system operating parameters may be set by the system controller 121. This may include controlling operation of the above-stated actuators. At 1210, impedance values of tuning circuits are set based on the selected process, recipe, and system operating parameters. The impedance values may also or alternatively be set based on features and/or characteristics of the processing chamber, ESC and/or substrate. As an example, look-up tables may be stored in memory of the system controller 121 and/or accessed by the system controller 121 relating the impedance values to other parameters, features and/or characteristics stated herein. The system controller 121 may also set the impedances 128 of the second RF matching network 129 as described above.

At 1212, the substrate may be arranged on the ESC. This may include providing clamping voltages to clamp the substrate to the ESC. At 1214, processing operations are performed. Example processing operations are cleaning operations, flowing gases, flowing and striking plasma, etching operations, deposition operations, annealing operations, post annealing operations, purging the process chamber, etc.

Operations 1216, 1218, 1220, 1222 may be performed while performing operation 1212. At 1216, sensor output signals including sensor output data of the substrate processing system are monitored. This may include receiving signals from the sensors 143, 144, 145 of FIG. 1. At 1218, parameters may be determined based on the sensor output signals from the sensors 143, 144, 145 and/or other sensors, data and/or corresponding measured values, such as temperatures, gas pressures, voltages, current levels, power levels, etc.

At 1220, the system controller 121 may determine whether to adjust impedance values of the tuning circuits based on the measured values and/or determined parameters. This determination may be based on the selected process, recipe, system operating parameters, and/or features and/or characteristics of processing chamber, ESC and/or substrate. The characteristics may dynamically change. In an embodiment, the impedance values are adjusted to follow predetermined trajectories based on the changes in the characteristics. The predetermined trajectories may be, for example, predetermined curves stored in memory. Tables may be stored in memory relating the impedance values to the other values and parameters. If one or more impedance values are to be changed, operation 1222 is performed, otherwise operation 1216 may be performed. In one embodiment, power supplied to one or more electrodes is modulated by changing the values of the corresponding impedances. This can be done to change stress, thicknesses, uniformity, a refractive index, an etch rate, a deposition rate, and/or other intrinsic values and/or profile parameters of the substrate.

At 1222, the system controller 121 adjusts the one or more impedance values of the tuning circuits by, for example, changing inductance, capacitance, impedance, and/or resistance of the one or more impedances. The adjustment (or amount of adjustment) may be based on the measured and/or determined parameters, selected process, recipe, system operating parameters, and/or features and/or characteristics of processing chamber, ESC and/or substrate. The system controller 121 may also adjust the impedances 128 of the second RF matching network 129 as described above. Subsequent to operation 1222, operation 1216 may be performed.

At 1224, the system controller 121 determines whether to modify the current process or perform another process. Operation 1202 may be performed if the current process is to be modified or another process is to be performed. The method may end at 1226 if the current process is not modified and no further process is to be performed.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

Figure 13:
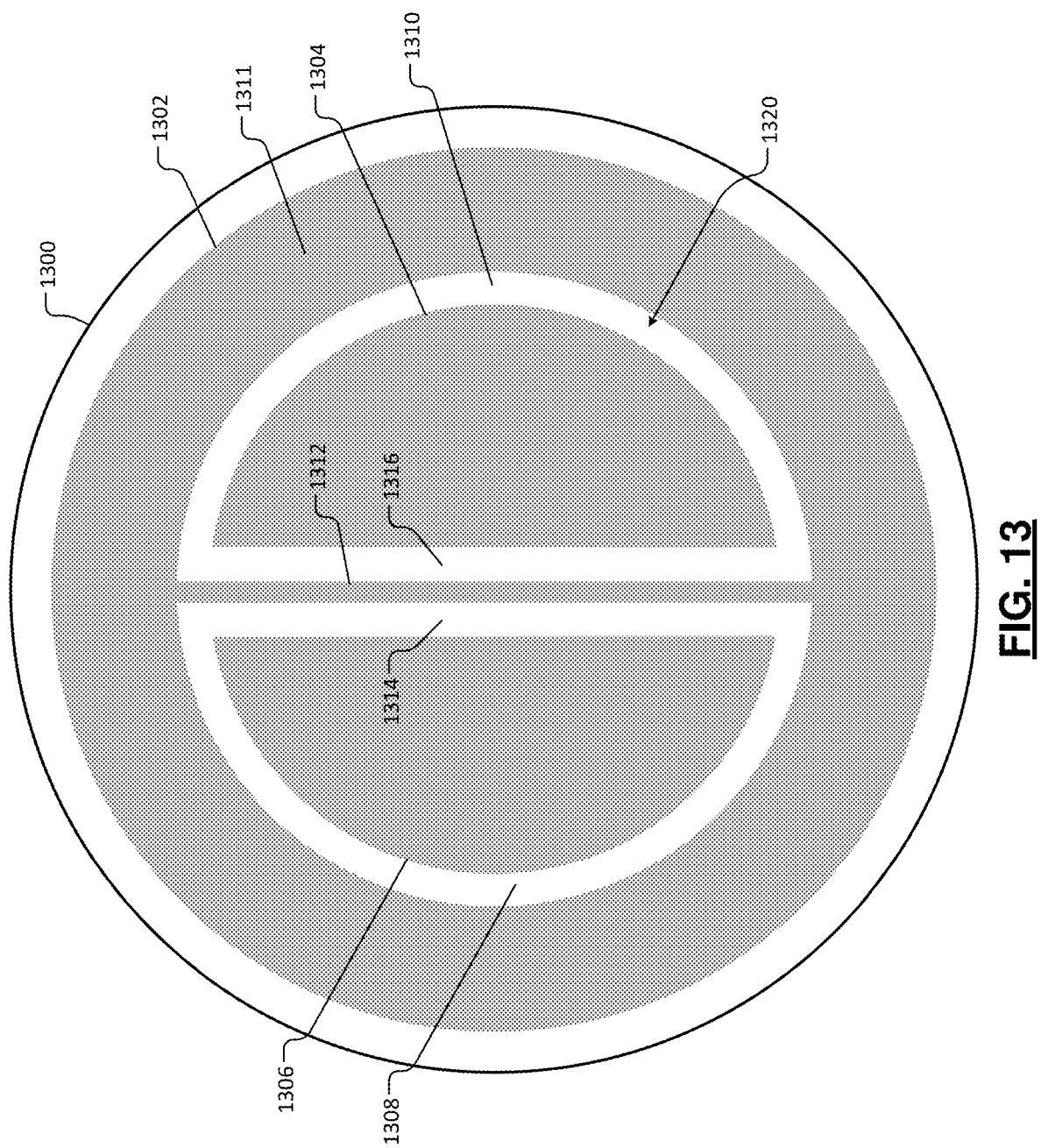
FIG. 13 is an example of a substrate support including an outer ring electrode and two inner electrodes in accordance with an embodiment of the present disclosure.

FIG. 13 shows an example of a substrate support 1300 including an outer ring electrode 1302 and two inner electrodes 1304, 1306. The electrodes 1302, 1304, 1306 are provided as an example of two inner electrodes and an outer ring electrode, as shown in FIGS. 3, 5, and 7-11. The inner electrodes 1304, 1306 may be D'-shaped electrodes and are disposed radially inward of the outer ring electrode 1302. Gaps 1308 and 1310 exist between the inner electrodes 1304, 1306 and the outer ring electrode 1302. The outer ring electrode 1302 may include an outer ring 1311 and a linearly-shaped center member 1312 that extends between the inner electrodes 1304, 1306. Gaps 1314 and 1316 may exist between the inner electrodes 1304, 1306 and the center member 1312. The center member 1312 extends between the inner electrodes 1304, 1306 and through a middle area 1320 of the outer ring 1311 to equally bifurcate the middle area 1320. In an embodiment, power is provided to the outer ring electrode 1302 at a center of the center member 1312. Power may be provided to portions of the inner electrodes 1304, 1306 near a middle of the center member 1312.

The above-described examples provide a RF tuning systems including tuning circuits having impedances for setting and adjusting parameters of electrodes in electrostatic chucks and/or other pedestals (or substrate supports). The pedestals may not be electrostatic chucks. This provides spatial tuning of power delivered to plasma in a processing chamber (e.g., a PECVD reactor). The examples provide new control parameters for film deposition and uniformity. As an example including an outer annular electrode and an inner circular electrode, relative intensity of plasma around the outer perimeter of the substrate may be altered by modulating power supplied to the electrodes. This may be accomplished by modulating (or adjusting) corresponding impedances, as described above. Unlike altering gas parameters or overall power, the modulating of the power provided to electrodes does not necessarily alter a global parameter affecting an entire substrate and allows a selected area of a film of a substrate to be altered (e.g., a circumferential edge of the film of the substrate). This is unlike traditional techniques that include use of metal or dielectric rings to alter an outer portion of plasma, which can result in gas flow variations and as a result have a global affect altering more of a film of a substrate film than a circumferential edge of the film.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from multiple fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for processing a substrate within a processing chamber, the substrate processing system comprising:
    a source terminal;
    a substrate support configured to hold the substrate, wherein the substrate support comprises a plurality of electrodes, wherein the plurality of electrodes includes a first electrode and a second electrode, wherein the first electrode and the second electrode receive power from a first power source via the source terminal, wherein the first power source supplies power to a matching network, and wherein the matching network is connected between the first power source and the source terminal; and
    a first tuning circuit connected to at least one of the first electrode and the second electrode and between the source terminal and the first electrode,
    wherein the first tuning circuit is allocated for tuning one or more signals provided to the first electrode, wherein the first tuning circuit comprises at least one of
        a first impedance set serially connected between the first electrode and the first power source, wherein the first impedance set receives a first signal from the first power source via the source terminal, and wherein the one or more signals include the first signal, or
        a second impedance set connected between an output of the first power source and a reference terminal, wherein the second impedance set receives the first signal from the first power source via the source terminal.

2. The substrate processing system of claim 1, wherein the first tuning circuit comprises the first impedance set and the second impedance set.

3. The substrate processing system of claim 1, further comprising a system controller configured to adjust values of impedances in the first impedance set and values of impedances in the second impedance set.

4. The substrate processing system of claim 1, wherein the first tuning circuit adjusts a voltage, a current level, a phase, a power level and/or a frequency of the one or more signals provided to the first electrode.

5. The substrate processing system of claim 1, wherein:
    the first tuning circuit comprises the first impedance set and the second impedance set; and
    the second impedance set is connected between the first impedance set and the reference terminal.

6. The substrate processing system of claim 1, wherein the first tuning circuit is not included in the matching network.

7. The substrate processing system of claim 6, wherein no matching network is connected between the first power source and the first tuning circuit.

8. The substrate processing system of claim 1, further comprising a second tuning circuit, wherein:
    the first tuning circuit is configured to adjust a voltage, a current level, a phase, a power level or a frequency of the first signal provided from the first power source to the first electrode;
    the second tuning circuit is configured to adjust a voltage, a current level, a phase, a power level or a frequency of the first signal provided from the first power source to the second electrode; and
    the one or more signals comprise the first signal.

9. The substrate processing system of claim 1, further comprising a second power source and a second tuning circuit, wherein:
    the first tuning circuit is configured to adjust a voltage, a current level, a phase, a power level or a frequency of the first signal provided from the first power source to the first electrode, and
    the second tuning circuit is configured to adjust a voltage, a current level, a phase, a power level or a frequency of a second signal provided from the second power source to the second electrode; and
    the one or more signals comprise the first signal and the second signal.

10. The substrate processing system of claim 1, wherein the plurality of electrodes are concentrically disposed.

11. The substrate processing system of claim 1, further comprising a second tuning circuit and a third tuning circuit, wherein:
    the plurality of electrodes includes a third electrode;
    the first tuning circuit is connected to the first electrode and is configured to modify the first signal prior to being received at the first electrode;
    the second tuning circuit is connected to the second electrode and is configured to modify the first signal or a second signal prior to being received at the second electrode; and the third tuning circuit is connected to the third electrode and is configured to modify the first signal or a third signal prior to being received at the third electrode.

12. The substrate processing system of claim 11, wherein the first electrode, the second electrode, and the third electrode are concentrically disposed.

13. The substrate processing system of claim 11, wherein:
the substrate support is an electrostatic chuck;
the first electrode and the second electrode are clamping electrodes and are configured to receive clamping voltages to clamp the substrate to the substrate support;
the third electrode is a bias electrode and configured to receive a bias voltage; and
the third signal is received by the third tuning circuit from a third power source.

14. The substrate processing system of claim 11, wherein:
the substrate support is an electrostatic chuck;
the first electrode is a clamping electrode;
the second electrode and the third electrode are bias electrodes; and
the second signal is received by the second tuning circuit from a second power source.

15. The substrate processing system of claim 1, wherein:
the substrate support is an electrostatic chuck;
the first electrode is a clamping electrode;
the second electrode is a clamping electrode;
the plurality of electrodes includes an electrode ring;
the first tuning circuit comprises the first impedance set, a third impedance set, and a fourth impedance set;
the first impedance set comprises a first inductor and a first capacitor connected between the first electrode and the first power source;
the third impedance set comprises a second inductor and a second capacitor connected between the electrode ring and the first power source; and
the fourth impedance set comprises a third inductor and a third capacitor connected between the second electrode and the first power source.

16. The substrate processing system of claim 1, wherein:
the substrate support is an electrostatic chuck;
the first electrode is a clamping electrode;
the second electrode is a clamping electrode;
the plurality of electrodes includes an electrode ring;
the first tuning circuit comprises the second impedance set, a third impedance set and a fourth impedance set;
the second impedance set comprises a first inductor and a first capacitor connected in parallel between a first electrode terminal and the reference terminal, wherein the first electrode terminal is connected between the first electrode and the first power source;
the third impedance set comprises a second inductor and a second capacitor connected in parallel between a second electrode terminal and the reference terminal, wherein the second electrode terminal is connected between the electrode ring and the first power source; and
the fourth impedance set comprises a third inductor and a third capacitor connected in parallel between a third electrode terminal and the reference terminal, wherein the third electrode terminal is connected between the second electrode and the first power source.

17. The substrate processing system of claim 1, wherein:
the substrate support is an electrostatic chuck;
the first electrode is a clamping electrode;
the second electrode is a clamping electrode;
the plurality of electrodes includes an electrode ring;
the first tuning circuit comprises the first impedance set, the second impedance set, a third impedance set, a fourth impedance set, a fifth impedance set, and a sixth impedance set;
the first impedance set comprises a first inductor and a first capacitor connected between the first electrode and the first power source;
the third impedance set comprises a second inductor and a second capacitor connected between the electrode ring and the first power source;
the fourth impedance set comprises a third inductor and a third capacitor connected between the second electrode and the first power source;
the second impedance set comprises a fourth inductor and a fourth capacitor connected in parallel between a first electrode terminal and the reference terminal, wherein the first electrode terminal is connected between the first electrode and the first power source;
the fifth impedance set comprises a fifth inductor and a fifth capacitor connected in parallel between a second electrode terminal and the reference terminal, wherein the second electrode terminal is connected between the electrode ring and the first power source; and
the sixth impedance set comprises a sixth inductor and a sixth capacitor connected in parallel between a third electrode terminal and the reference terminal, wherein the third electrode terminal is connected between the second electrode and the first power source.

18. The substrate processing system of claim 17, wherein a second power source is connected to the first electrode terminal, the second electrode terminal and the third electrode terminal.

19. The substrate processing system of claim 1, further comprising a second tuning circuit, wherein:
the substrate support is an electrostatic chuck;
the first electrode is a first clamping electrode;
the second electrode is a second clamping electrode;
the plurality of electrodes includes an electrode ring;
the first tuning circuit comprises the first impedance set, a third impedance set, and a fourth impedance set;
the second tuning circuit comprises the second impedance set, a fifth impedance set, and a sixth impedance set;
the first impedance set comprises a first inductor and a first capacitor connected between the first clamping electrode and the first power source;
the third impedance set comprises a second inductor and a second capacitor connected between the electrode ring and a second power source;
the fourth impedance set comprises a third inductor and a third capacitor connected between the second clamping electrode and the first power source;
the second impedance set comprises a fourth inductor and a fourth capacitor connected in parallel between a first electrode terminal and the reference terminal, wherein the first electrode terminal is connected between the first clamping electrode and the first power source;
the fifth impedance set comprises a fifth inductor and a fifth capacitor connected in parallel between a second electrode terminal and the reference terminal, wherein the second electrode terminal is connected between the electrode ring and the second power source; and
the sixth impedance set comprises a sixth inductor and a sixth capacitor connected in parallel between a third electrode terminal and the reference terminal, wherein the third electrode terminal is connected between the second clamping electrode and the first power source.

20. The substrate processing system of claim 1, wherein no matching network is connected between the source terminal and the plurality of electrodes.

21. The substrate processing system of claim 1, wherein power from the first power source is split to provide portions of the power respectively to the plurality of electrodes.

22. The substrate processing system of claim 1, wherein the first impedance set and the second impedance set include variable inductances.

23. The substrate processing system of claim 1, further comprising:
the processing chamber;
the first power source; and
a controller configured to adjust impedances of the first impedance set and the second impedance set.

24. A substrate processing system for processing a substrate within a processing chamber, the substrate processing system comprising:
a substrate support configured to hold the substrate, wherein the substrate support includes a plurality of electrodes, and wherein the plurality of electrodes comprise a first electrode, a second electrode and a third electrode;
a first impedance connected between the first electrode and the third electrode; and
a second impedance connected between the second electrode and the third electrode,
wherein
the first impedance is connected (i) between the first electrode and the second impedance, and (ii) between a first power source and the second impedance,
the second impedance is connected (i) between the second electrode and the first impedance, and (ii) between a second power source and the first impedance, and
the first impedance and the second impedance are allocated for tuning (i) a first signal provided by the first power source to the first electrode, and (ii) a second signal provided by the second power source to the second electrode.

25. The substrate processing system of claim 24, wherein the first impedance is connected in series with the second impedance.

26. The substrate processing system of claim 24, wherein:
the first impedance is connected between the first electrode and a third power source; and
the second impedance is connected between the second electrode and the third power source.

27. The substrate processing system of claim 26, wherein the third power source is connected to the third electrode.

28. The substrate processing system of claim 24, further comprising a third impedance and a fourth impedance, wherein:
the third impedance is connected (i) between the first electrode and the third electrode, (ii) between the first electrode and the fourth impedance, and (iii) between the first power source and the fourth impedance; and
the fourth impedance is connected (i) between the second electrode and the third electrode, (ii) between the second electrode and the third impedance, and (iii) between the second power source and the third impedance,
the third impedance and the fourth impedance are allocated for tuning (i) the first signal provided by the first power source to the first electrode, and (ii) the second signal provided by the second power source to the second electrode.

29. The substrate processing system of claim 28, wherein:
the first impedance and the third impedance are connected in parallel between the first electrode and a third power source; and
the second impedance and the fourth impedance are connected in parallel between the second electrode and the third power source.

30. The substrate processing system of claim 29, wherein the third power source is connected to the third electrode.

31. The substrate processing system of claim 24, wherein the first impedance set and the second impedance set include variable inductances.

32. The substrate processing system of claim 24, further comprising:
the processing chamber;
the first power source; and
a controller configured to adjust impedances of the first impedance set and the second impedance set.

33. A substrate processing system for processing a substrate within a processing chamber, the substrate processing system comprising:
a source terminal;
a substrate support configured to hold the substrate, wherein the substrate support comprises a plurality of electrodes, wherein the plurality of electrodes includes a first electrode and a second electrode;
a first tuning circuit connected to the first electrode and allocated for tuning impedances of the first electrode, wherein the first tuning circuit comprises a first impedance set connected to the first electrode and a ground; and
a second tuning circuit connected to the second electrode and allocated for tuning impedances of the second electrode, wherein the second tuning circuit comprises a second impedance set connected to the second electrode and the ground.

34. The substrate processing system of claim 33, wherein the first tuning circuit is connected in series between the first electrode and the ground.

35. The substrate processing system of claim 34, wherein the first tuning circuit comprises an inductor and a capacitor.

36. The substrate processing system of claim 35, wherein the second tuning circuit is connected in series between the second electrode and the ground.

37. The substrate processing system of claim 36, wherein the second tuning circuit comprises an inductor and a capacitor.

38. The substrate processing system of claim 33, wherein:
the first tuning circuit is connected between the first electrode and the second electrode; and
the first electrode and the second electrode are connected to the ground.

39. The substrate processing system of claim 38, further comprising:
a third electrode connected to the ground; and
a third tuning circuit connected between the second electrode and the third electrode.

40. The substrate processing system of claim 39, wherein:
the first tuning circuit comprises a first inductor and a first capacitor; and
the second tuning circuit comprises a second inductor and a second capacitor.

41. The substrate processing system of claim 33, wherein the first tuning circuit and the second tuning circuit include variable inductances.

42. The substrate processing system of claim 33, further comprising:
the processing chamber; and
a controller configured to adjust impedances of the first impedance set and the second impedance set.

* * * * *